United States Patent
Hsieh et al.

(10) Patent No.: US 12,261,036 B2
(45) Date of Patent: Mar. 25, 2025

(54) FORMING LOW-STRESS SILICON NITRIDE LAYER THROUGH HYDROGEN TREATMENT

(71) Applicant: Taiwan Semiconductor Manufacturing Co., Ltd., Hsinchu (TW)

(72) Inventors: Wei-Che Hsieh, New Taipei (TW); Ching Yu Huang, Hsinchu (TW); Hsin-Hao Yeh, Taipei (TW); Chunyao Wang, Zhubei (TW); Tze-Liang Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/358,508

(22) Filed: Jul. 25, 2023

(65) Prior Publication Data

US 2023/0386826 A1   Nov. 30, 2023

Related U.S. Application Data

(63) Continuation of application No. 17/809,917, filed on Jun. 30, 2022, now Pat. No. 11,830,727, which is a (Continued)

(51) Int. Cl.
*H01L 21/02* (2006.01)
*H01L 21/033* (2006.01)
(Continued)

(52) U.S. Cl.
CPC .... *H01L 21/0217* (2013.01); *H01L 21/02208* (2013.01); *H01L 21/0228* (2013.01); *H01L 21/0337* (2013.01); *H01L 21/3081* (2013.01); *H01L 21/3086* (2013.01); *H01L 21/76224* (2013.01); *H01L 21/823431* (2013.01);
(Continued)

(58) Field of Classification Search
None
See application file for complete search history.

(56) References Cited

U.S. PATENT DOCUMENTS

| | | | |
|---|---|---|---|
| 6,468,924 | B2 | 10/2002 | Lee et al. |
| 7,625,609 | B2 | 12/2009 | Matsuura |

(Continued)

FOREIGN PATENT DOCUMENTS

| | | |
|---|---|---|
| CN | 1841676 A | 10/2006 |
| CN | 104658892 A | 5/2015 |

(Continued)

*Primary Examiner* — Alexander G Ghyka
(74) *Attorney, Agent, or Firm* — Slater Matsil, LLP

(57) ABSTRACT

A method includes placing a wafer into a process chamber, and depositing a silicon nitride layer on a base layer of the wafer. The process of depositing the silicon nitride layer includes introducing a silicon-containing precursor into the process chamber, purging the silicon-containing precursor from the process chamber, introducing hydrogen radicals into the process chamber, purging the hydrogen radicals from the process chamber; introducing a nitrogen-containing precursor into the process chamber, and purging the nitrogen-containing precursor from the process chamber.

20 Claims, 27 Drawing Sheets

Related U.S. Application Data continuation of application No. 15/983,565, filed on May 18, 2018, now Pat. No. 11,393,674.

(51) Int. Cl.
  *H01L 21/308* (2006.01)
  *H01L 21/762* (2006.01)
  *H01L 21/8234* (2006.01)
  *H01L 29/66* (2006.01)
  *H01L 29/78* (2006.01)

(52) U.S. Cl.
  CPC .. *H01L 29/66545* (2013.01); *H01L 29/66795* (2013.01); *H01L 29/785* (2013.01)

(56) References Cited

U.S. PATENT DOCUMENTS

| | | | |
|---|---|---|---|
| 7,709,396 | B2 | 5/2010 | Bencher et al. |
| 9,589,800 | B2 | 3/2017 | Tung et al. |
| 9,865,589 | B1 | 1/2018 | Lee et al. |
| 10,164,071 | B2 | 12/2018 | Peng et al. |
| 10,262,870 | B2 | 4/2019 | Chen et al. |
| 10,276,559 | B2 | 4/2019 | Lee et al. |
| 11,393,674 | B2 | 7/2022 | Hsieh et al. |
| 2002/0068466 | A1 | 6/2002 | Lee et al. |
| 2004/0121085 | A1 | 6/2004 | Wang et al. |
| 2005/0059260 | A1* | 3/2005 | Bu ................ H01L 29/6656 257/288 |
| 2006/0216418 | A1 | 9/2006 | Matsuura |
| 2014/0273528 | A1 | 9/2014 | Niskanen et al. |
| 2015/0118815 | A1 | 4/2015 | Lin et al. |
| 2016/0079054 | A1 | 3/2016 | Chen et al. |
| 2016/0104793 | A1 | 4/2016 | Ching |
| 2016/0351568 | A1 | 12/2016 | Chang et al. |
| 2017/0062204 | A1 | 3/2017 | Suzuki et al. |
| 2018/0122637 | A1 | 5/2018 | Sherpa et al. |

FOREIGN PATENT DOCUMENTS

| | | |
|---|---|---|
| CN | 106505104 A | 3/2017 |
| CN | 108010967 A | 5/2018 |
| JP | 2010114424 A | 5/2010 |
| KR | 20020044422 A | 6/2002 |
| KR | 20040059462 A | 7/2004 |
| KR | 20090103871 A | 10/2009 |
| KR | 20160140321 A | 12/2016 |
| KR | 20170130327 A | 11/2017 |

\* cited by examiner

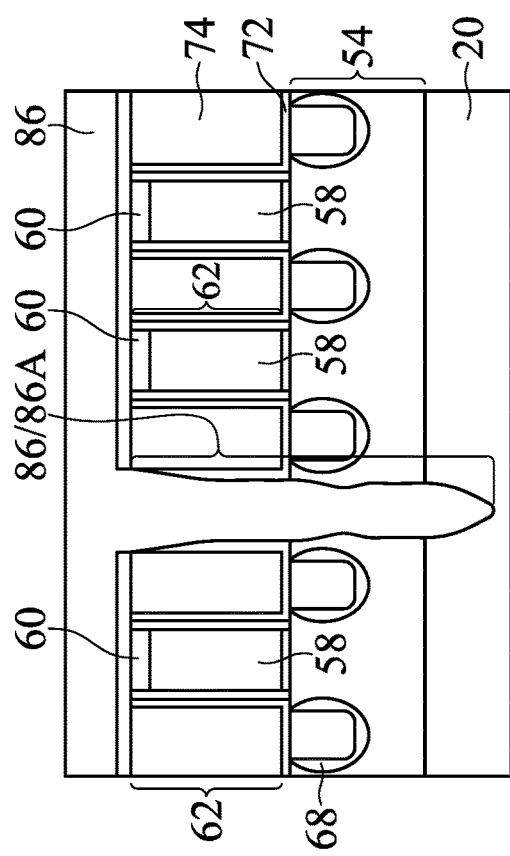
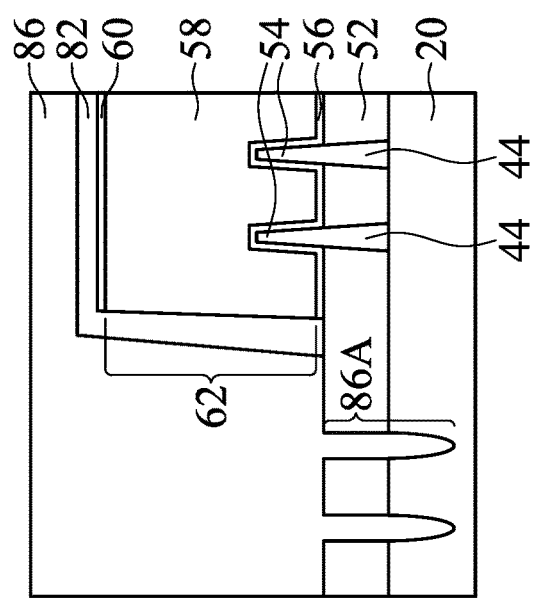
FIG. 23A
FIG. 23B

… … …

FORMING LOW-STRESS SILICON NITRIDE LAYER THROUGH HYDROGEN TREATMENT

PRIORITY CLAIM AND CROSS-REFERENCE

This application is a continuation of U.S. patent application Ser. No. 17/809,917, entitled "Forming Low-Stress Silicon Nitride Layer Through Hydrogen Treatment," filed on Jun. 30, 2022, which is a continuation of U.S. patent application Ser. No. 15/983,565, entitled "Forming Low-Stress Silicon Nitride Layer Through Hydrogen Treatment," filed on May 18, 2018, now U.S. Pat. No. 11,393,674, issued Jul. 19, 2022, which applications are incorporated herein by reference.

BACKGROUND

In the formation of integrated circuits, multiple layers are formed. These layers may be removed in subsequent processes, or may be left in the final structure. These layers often have undesirable stresses, which cause problems in the resulting devices. For example, the stress may cause the shift of the positions of some features, and may also cause the drift of electrical properties of some devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6 through 24 illustrate the cross-sectional views and perspective views of intermediate stages in the formation of Fin Field-Effect Transistors (FinFETs) incorporating silicon nitride layers in accordance with some embodiments.

DETAILED DESCRIPTION

Figure 1:
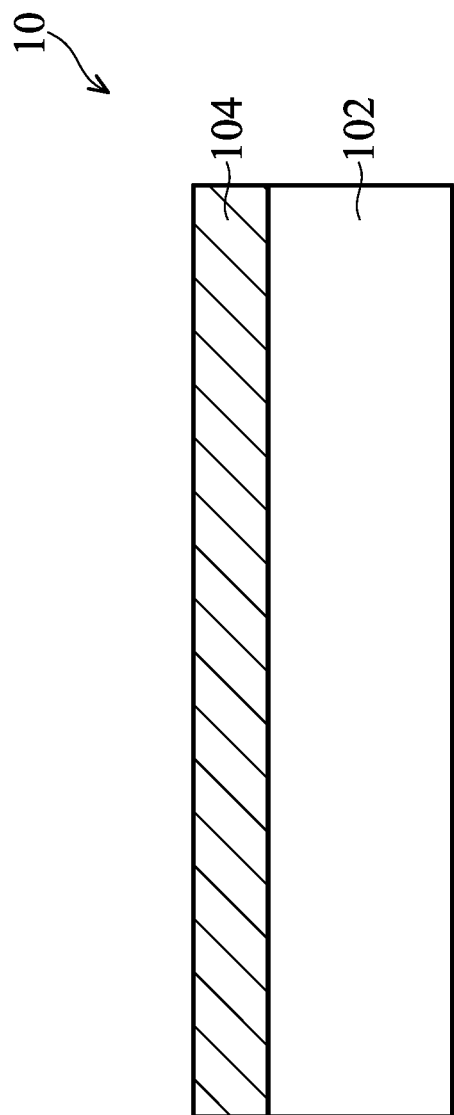
FIG. 1 illustrates the deposition of a silicon nitride layer in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A silicon nitride layer and the method of forming the same are provided in accordance with some embodiments. The intermediate stages of forming Fin Field-Effect Transistors (FinFETs) incorporating the formation of the silicon nitride layers are illustrated in accordance with some embodiments. Some variations of some embodiments are discussed. Throughout the various views and illustrative embodiments, like reference numbers are used to designate like elements.

FIG. 1 schematically illustrates wafer 10, which includes base layer 102 and silicon nitride layer 104 formed on base layer 102 in accordance with some embodiments of the present disclosure. Base layer 102 may be selected from different features in accordance with some embodiments of the present disclosure. For example, base layer 102 may be a crystalline semiconductor (such as silicon or silicon germanium) substrate, a dielectric feature such as a gate spacer, a mandrel (such as an amorphous silicon feature), or the composite feature including a plurality of types of materials. Silicon nitride layer 104 is formed using Atomic Layer Deposition (ALD).

Figure 2A:
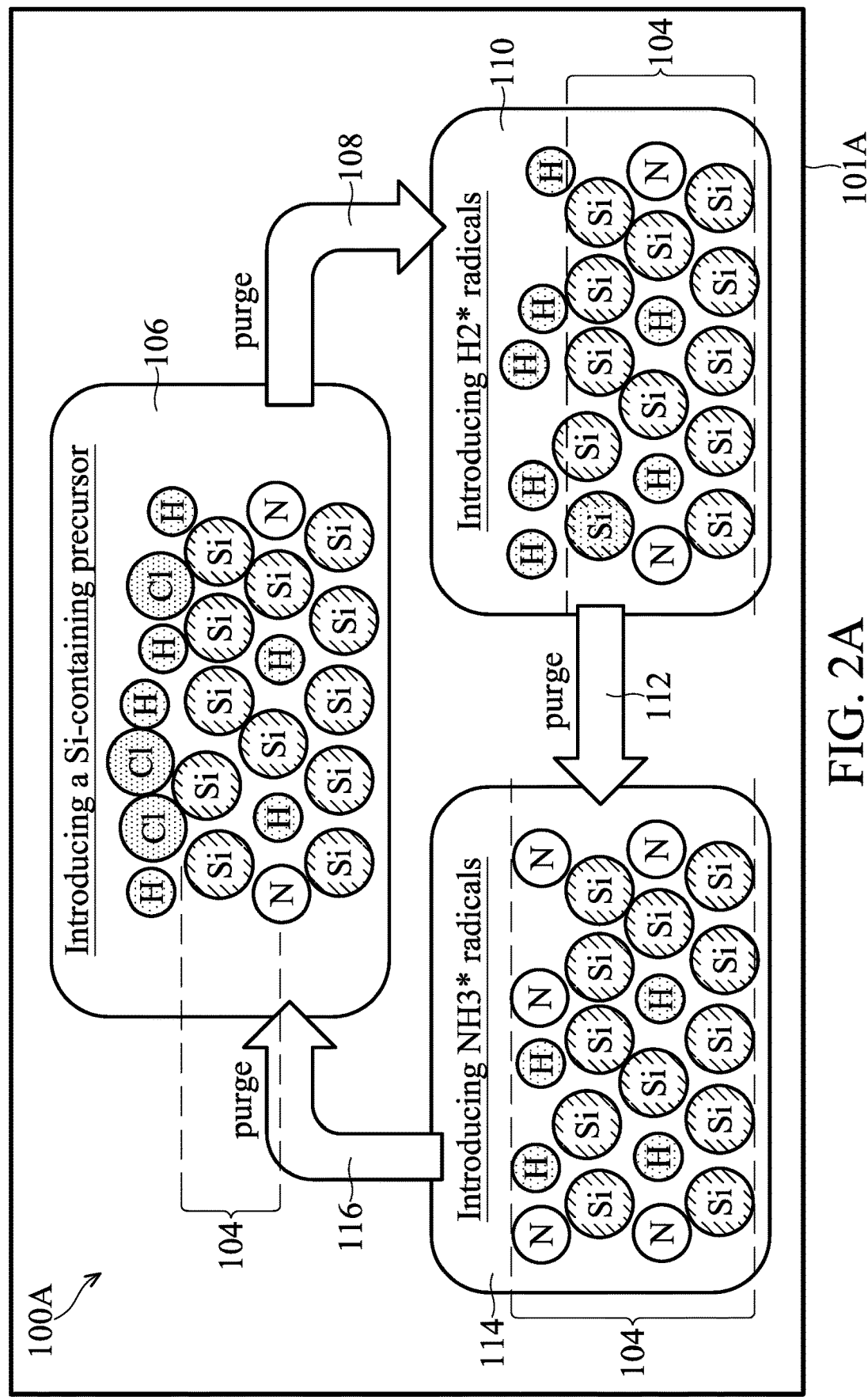
FIGS. 2A and 2B illustrate Atomic Layer Deposition (ALD) cycles in the formation of silicon nitride layers in accordance with some embodiments.

FIG. 2A illustrate process 100A for forming silicon nitride layer 104 (FIG. 1) through ALD in accordance with some embodiments of the present disclosure. Process 100A is performed in process chamber 101A through a plurality of cycles, each forming an atomic layer of silicon nitride layer 104 (FIG. 1). Block 106 represents the step of introducing a silicon-containing precursor into process chamber 101A. The silicon-containing precursor may include silicon and possibly a halogen element such as chlorine, fluorine, bromine, and/or iodine. In accordance with some embodiments of the present disclosure, the silicon-containing precursor includes DiChloroSilane (DCS, $SiH_2Cl_2$). When a cycle is performed, there may already be silicon nitride layer 104 on wafer to formed in previous cycles, and the newly formed silicon nitride layer will be formed on top of the existing layer. The elements at the surface of the underlying silicon nitride layer 104 include silicon (Si), hydrogen (H), chlorine (Cl), and nitrogen (N). The elements are illustrated schematically.

Next, referring to the arrow 108, which represents the purge of process chamber 101A, for example, using nitrogen ($N_2$) as a purge gas. After the purge, hydrogen (H) radicals, which may include $H_2^*$ radicals, are introduced into the process chamber, as shown as step no in FIG. 2A. During this step, no silicon-containing process gas and silicon radicals are introduced, and no nitrogen-containing process gas and nitrogen radicals are introduced. $H_2^*$ radicals may be generated through remote plasma, in which a plasma is generated using $H_2$ gas as a process gas. The plasma is generated remotely from the process gas in a tool away from process chamber 101A, and the resulting plasma is filtered to remove ions, and only radicals that are neither negatively charged nor positively charged are left and are introduced into the process chamber. The flow rate of $H_2$ may be in the range between about 2 slm and about 8 slm. The pressure of $H_2*$ radicals may be in the range between about 0.01 torr and about 0.18 torr. The $H_2*$ radicals, being activated, are easy to react with other molecules. The $H_2*$ radicals react with the DCS, and some of the chlorine atoms in the DCS molecule form HCl with the $H_2*$ radicals, and HCl is removed through the subsequent purging. Also, the hydrogen atoms attached to or inside silicon nitride layer 104 react with the hydrogen radicals to form $H_2$, and are also removed. Accordingly, the amount of the Cl on the surface of silicon nitride layer 104 is reduced. During the reaction, the respective wafer 10 (FIG. 1) is heated, for example, to a temperature in the range between about 350° C. and about 550° C. The temperature may also be in the range between about 350° C. and about 450° C.

Figure 3:
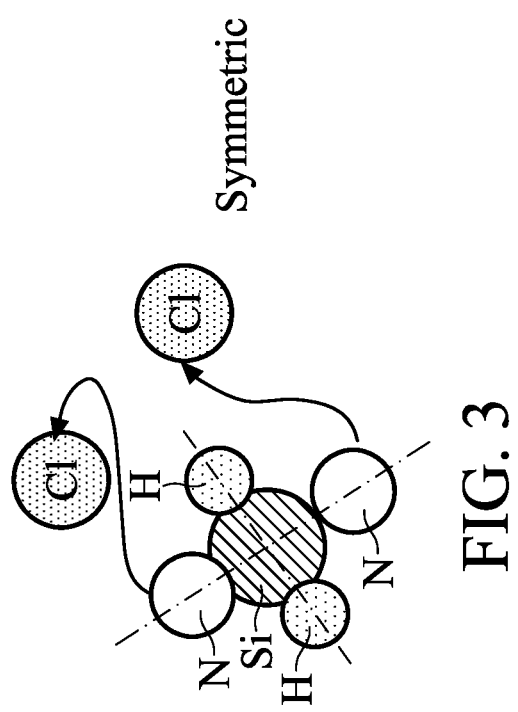
FIGS. 3 and 4 illustrate symmetric and asymmetric molecules of silicon nitride in accordance with some embodiments.
Figure 4:
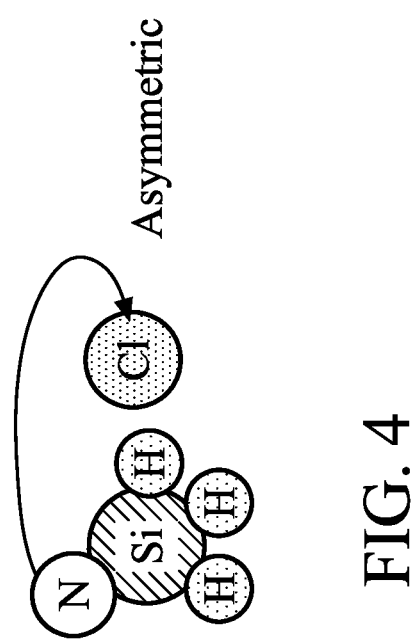

FIG. 3 schematically illustrates a molecule including a silicon atom, two nitrogen atoms, and two chlorine atoms. Chlorine atoms join with nitrogen to form N—Cl bonds, as shown in FIG. 3. There are two N—Cl bonds for each molecule in the illustrated molecule, and the two N—Cl bonds form a symmetric structure. The symmetric structure is prone to stretch and contraction, and hence the stress in the resulting silicon nitride layer is high. As a comparison, by performing step 110 in FIG. 2A, the number of chlorine atoms is reduced, and more asymmetric structures as shown in FIG. 4 are formed. FIG. 4 illustrates an asymmetric molecule, which includes one N—Cl bond due to the removal of one N—Cl bond. Generally, the more chlorine atoms are removed from silicon nitride layers, the more symmetric molecules will be converted into asymmetric molecules. The silicon nitride layers having more asymmetric molecules have smaller stresses than the silicon nitride layer having more symmetric molecules, and neutral stress may be achieved in the as-formed silicon nitride layer 104 when process 100A in FIG. 2A is adopted. The term "as-formed layer" means the layer is as deposited without going through any stress-reducing measure.

Next, referring back to FIG. 2A, process chamber 101A is purged, as represented by arrow 112. The purge may be performed using nitrogen ($N_2$) as a purge gas. After the purge, a nitrogen-containing process gas is introduced. The nitrogen-containing process gas may include ammonia ($NH_3$), which may also be in the form of $NH_3*$ radicals. The $NH_3*$ radicals may be generated through remote plasma, which is generated remotely in a tool away from process chamber 101A. The plasma is filtered to removed charged ions and molecules, leaving radicals such as the $NH_3*$ radicals. The radicals are then conducted into process chamber 101A. The $NH_3*$ radicals react with Si—H bonds to break the bonds between silicon and hydrogen, and hence Si—N bonds are generated, resulting in an atomic layer of silicon nitride.

After the introduction of $NH_3*$ radicals, process chamber 101A is purged, for example, using nitrogen ($N_2$) as a purge gas. The purge is represented by arrow 116. One cycle for forming one layer of silicon nitride is thus finished. Another ALD cycle may be started. The deposition of silicon nitride layer 104 (FIG. 1) may include a plurality of ALD cycles as illustrated in FIG. 2A.

It is appreciated that within the same cycle, the introduction of $H_2*$ radicals is performed after the introduction of DCS and before the introduction of the $NH_3*$ radicals. This sequence may remove the chlorine atoms before the nitrogen-containing radicals are introduced, and hence the number of chlorine may be reduced through the reaction of $H_2*$ radicals with DCS. If the sequence is changed, and $H_2*$ radicals are introduced after the introduction of $NH_3*$ radicals, the $NH_3*$ radicals would have already reacted with the DCS, and it is more difficult to remove the chlorine atoms, if possible at all. The effect of converting symmetric structures to asymmetric structures, which is through the removal of chlorine atoms, would be significantly compromised.

Figure 2B:
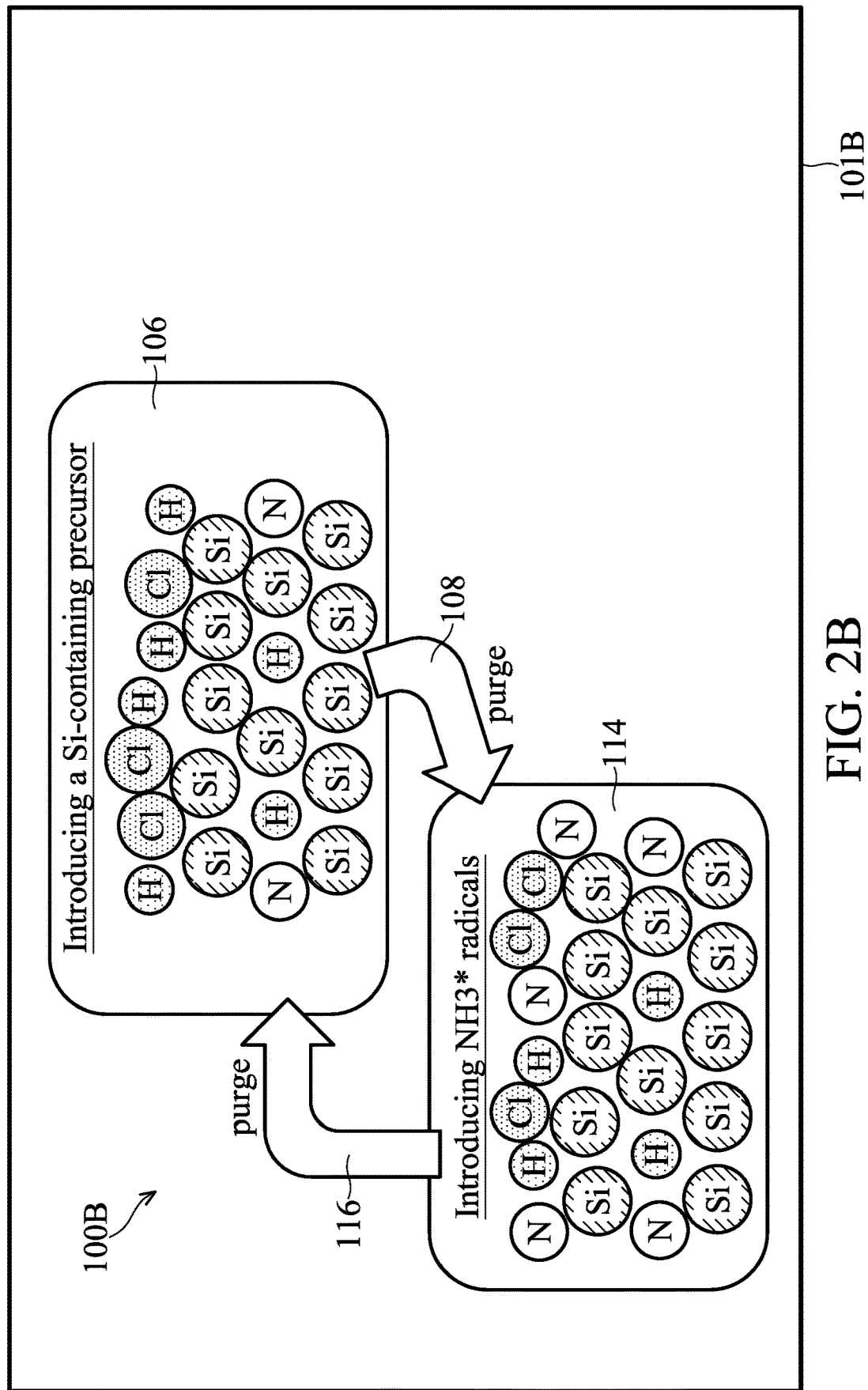

FIG. 2B illustrates process 100B for forming a silicon nitride layer using ALD. This process includes steps 106, 108, 114, and 116 as shown in process 100A (FIG. 2A). The steps of introducing hydrogen radicals and the subsequent purging of the hydrogen radicals are skipped. Steps 106, 108, 114, and 116 may be similar to the corresponding steps shown in FIG. 2A, and hence the details are not repeated.

Figure 5:
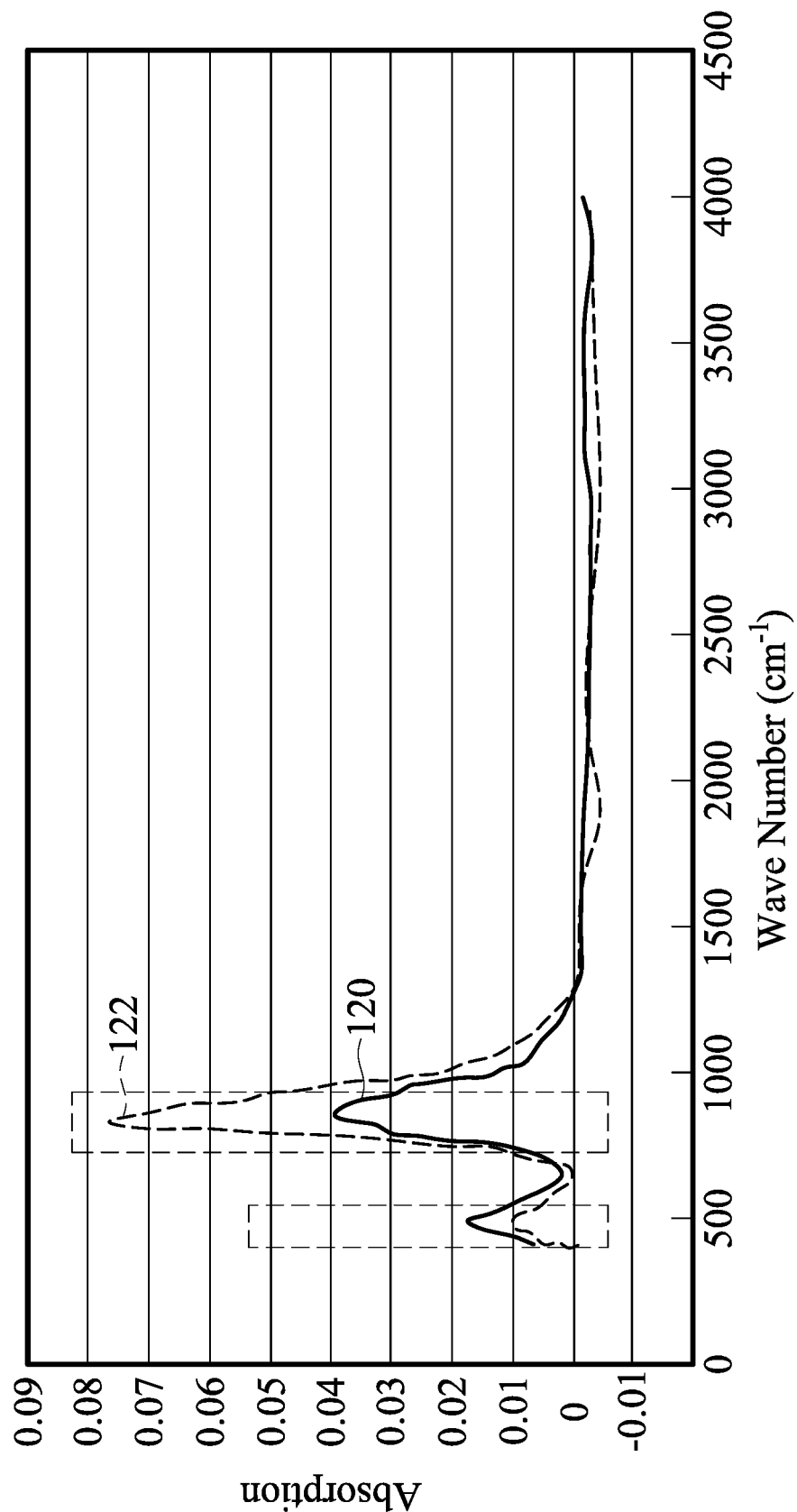
FIG. 5 illustrates the absorption spectrum of some silicon nitride samples formed using different methods in accordance with some embodiments.

FIG. 5 illustrates the absorption spectrum obtained through Fourier transform Infra-Red (FTIR) spectroscopy, wherein the absorption peak height is illustrated as a function of wave number ($cm^{-1}$). Line 120 is obtained from the silicon nitride layer formed using process 100B in FIG. 2B, in which the step of introducing $H_2*$ radicals is skipped. Line 122 is obtained from the silicon nitride layer formed using process 100A as shown in FIG. 2A. As shown in FIG. 5, the peak of line 120 at wave number 500 is high, indicating the respective film has more symmetric structures. The peak of line 122 at wave number 500 is low, indicating the respective silicon nitride layer has fewer symmetric structures. Accordingly, the stress of the silicon nitride layer corresponding to line 122 is smaller than the stress of the silicon nitride layer corresponding to line 120.

Referring back to FIG. 1, the resulting silicon nitride layer 104 formed using the process 100A (FIG. 2A) has a stress smaller than about 0.4 GPa (either compressive or tensile), which may be considered as a substantially neutral stress in accordance with some embodiments. The stress may also be smaller than about 0.2 GPa (either compressive or tensile), which may be considered as a neutral stress in accordance with some embodiments. The small stress or the neutral stress may reduce various adverse effects in the production of integrated circuits, as will be discussed in the subsequently discussed embodiments. Also, by adopting the process as shown in FIG. 2A, with $H_2*$ radicals introduced, the resulting silicon nitride layer has a higher density, which may be higher than about 2.9 g/cm³. In addition, assuming the Si/N atomic ratio of a first silicon nitride layer formed using process 100A (FIG. 2A) has a first Si/N ratio SN1, which is the atomic ratio of the number of Si atoms to the number of N atoms, and a second silicon nitride layer formed using process 100B (FIG. 2B) has a second Si/N ratio SN2, ratio SN1 is greater than SN2 in order to achieve a lower stress in the first silicon nitride layer. Ratio SN1/SN2 may be greater than about 1.6. Also, the ratio of SN2/SN1 may be in the range between about 0.53 and about 0.85.

As a comparison, if process 100B as shown in FIG. 2B is adopted to form a silicon nitride layer, and $H_2*$ radicals are not used, the resulting silicon nitride layers have higher stress, which may be about 1 GPa or higher (such as about 1.25 GPa). Also, the respective silicon nitride layers formed using process 100B have densities lower than about 2.8 g/cm³, which may be around 2.7 g/cm³. A dense silicon nitride layer is beneficial for the protection of underlying layers, and hence are good etch stop layers. Also, due to the removal of chlorine, the resulting silicon nitride layer has a chlorine atomic percentage lower than about 0.1% and greater than 0 percent, or lower than about 0.04% and greater than 0 percent. The chlorine atomic percentage may be in the range between about 0.005% and about 0.02% in accordance with some embodiments.

FIGS. 6 through 24 illustrate the cross-sectional views and perspective views of intermediate stages in the formation of FinFETs in accordance with some embodiments of the present disclosure. The steps shown in FIGS. 6 through 24 are also reflected schematically in the process flow 200 shown in FIG. 25. In the process shown in FIGS. 6 through 24, the processes shown in FIG. 2A and FIG. 2B are selectively used (depending on the stress requirement) in various steps in the formation of silicon nitride layers to achieve optimum results.

Figure 6:
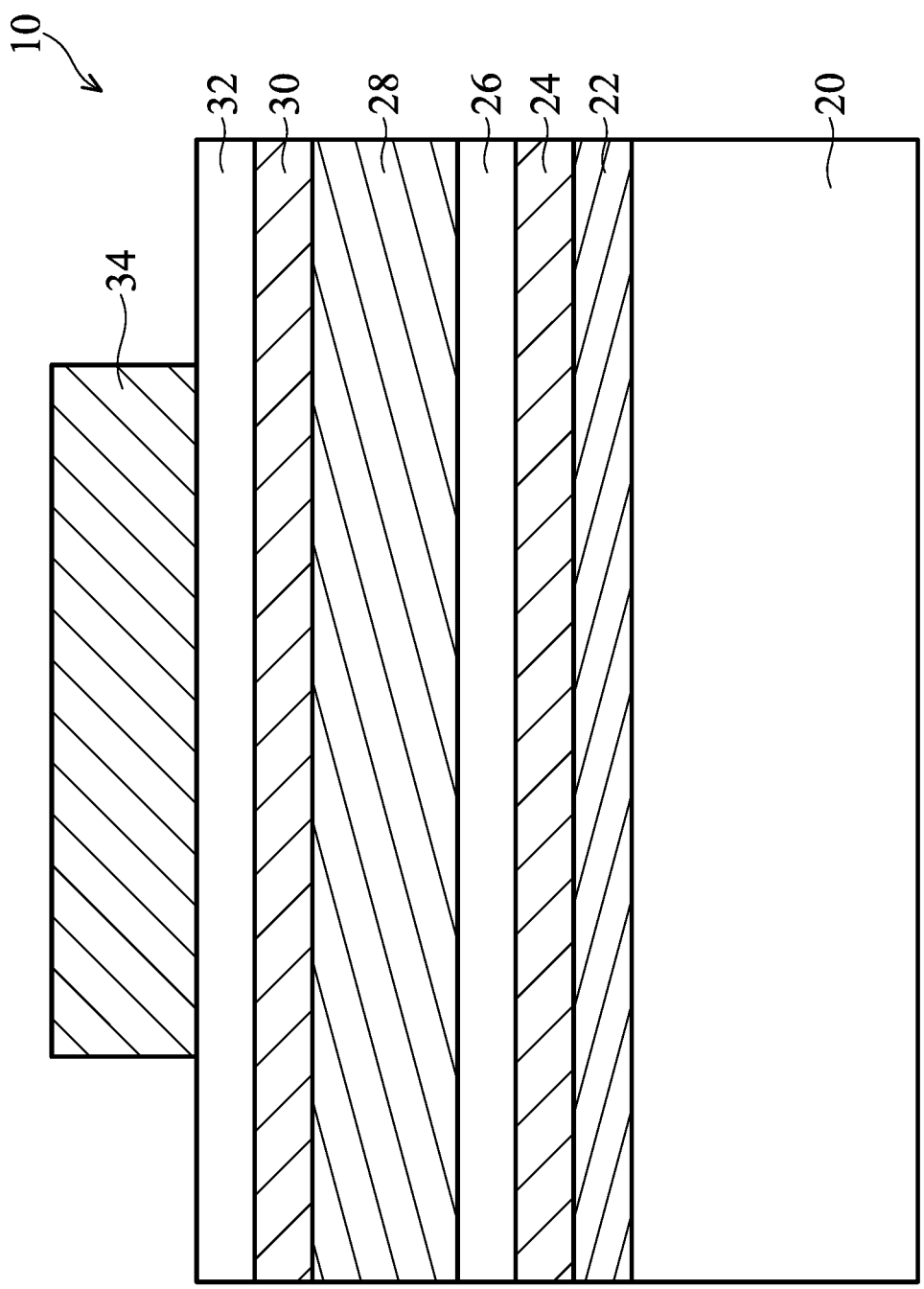

FIG. 6 illustrates a portion of wafer 10, which includes substrate 20 and a plurality of layers formed over substrate 20. Substrate 20 may be formed of a semiconductor material such as silicon, silicon germanium, or the like. In accordance with some embodiments of the present disclosure, substrate 20 is a crystalline semiconductor substrate such as a crystalline silicon substrate, a crystalline silicon carbon substrate, a crystalline silicon germanium substrate, a III-V compound semiconductor substrate, or the like.

Over substrate 20 resides a plurality of layers. It is appreciated that depending on the process, different number of layers may be adopted. In accordance with some embodiments, the layers include layer 22, hard mask layer 24, layer 26, amorphous silicon layer 28, silicon nitride layer 30, and oxide layer 32. Layer 22 may be referred to as a pad layer, and may be formed by performing a thermal oxidation on a surface layer of substrate 20. Layers 26 and 32 may be formed of silicon oxide (such as tetraethylorthosilicate (TEOS) oxide), Nitrogen-Free Anti-Reflective Coating (NFARC, which is an oxide), silicon carbide, silicon oxynitride, or the like. The formation methods include Plasma Enhance Chemical Vapor Deposition (PECVD), High-Density Plasma (HDP) deposition, or the like. Layers 24 and 30 may be silicon nitride layers formed using PECVD, ALD, or the like. In accordance with some embodiments of the present disclosure, each of silicon nitride layers 24 and 30 is formed using ALD, and the formation may be achieved through process 100A in FIG. 2A or process 100B in FIG. 2B in accordance with some embodiments.

Mandrels 34 are formed over oxide layer 32, which is over substrate 20. The respective process is illustrated as process 202 in the process flow shown in FIG. 25. In accordance with some embodiments of the present disclosure, mandrels 34 are formed of amorphous silicon or another material that has a high etching selectivity relative to the underlying layer 32. Mandrels 34 are formed by depositing a blanket layer, and then etching the blanket layer to form mandrels 34. The patterning of mandrels is achieved by forming a patterned photo resist or a tri-layer.

If viewed from top, mandrels 34 form elongated strips parallel to each other, and the cross-sectional view shown in FIG. 6 is obtained from a plane perpendicular to the lengthwise directions of mandrel strips 34.

Figure 7:
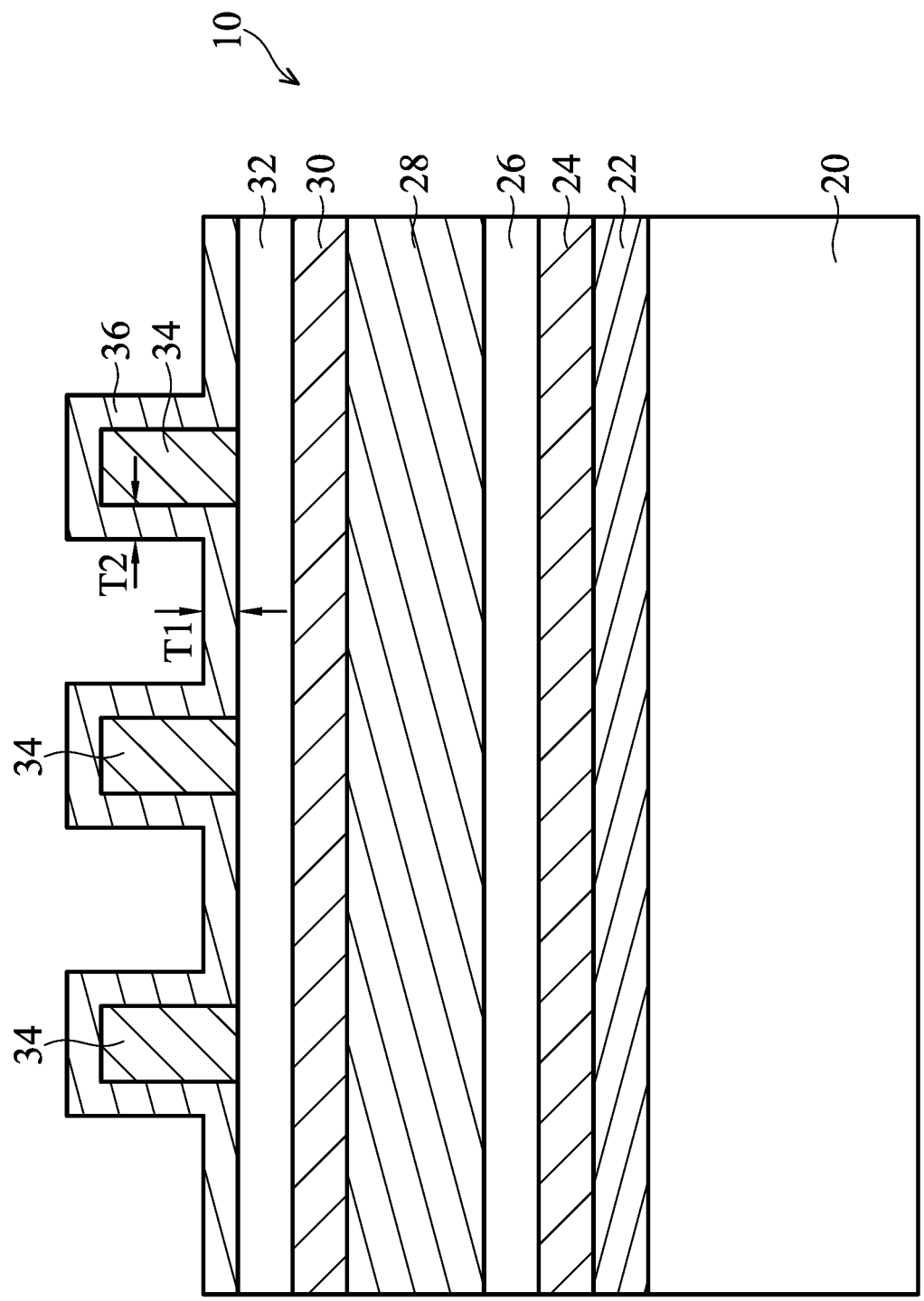

Referring to FIG. 7, spacer layer 36 is formed on mandrels 34 in accordance with some embodiments of the present disclosure. The respective process is illustrated as process 204 in the process flow shown in FIG. 25. Spacer layer 36 is a conformal layer, with the thickness T1 of its horizontal portions and the thickness T2 of its vertical portions being close to each other, for example, with a difference between thicknesses T1 and T2 smaller than about 20 percent of thickness T1. In accordance with some embodiments of the present disclosure, spacer layer 36 comprises silicon nitride, and is formed using process 100A as shown in FIG. 2A. Accordingly, spacer layer 36 has a low stress, and may have a neutral or substantially neutral stress. In accordance with these embodiments, spacer layer 36 corresponds to layer 104 in FIG. 1, and mandrels 34 and layer 32 correspond to base layer 102 in FIG. 1.

Figure 8:
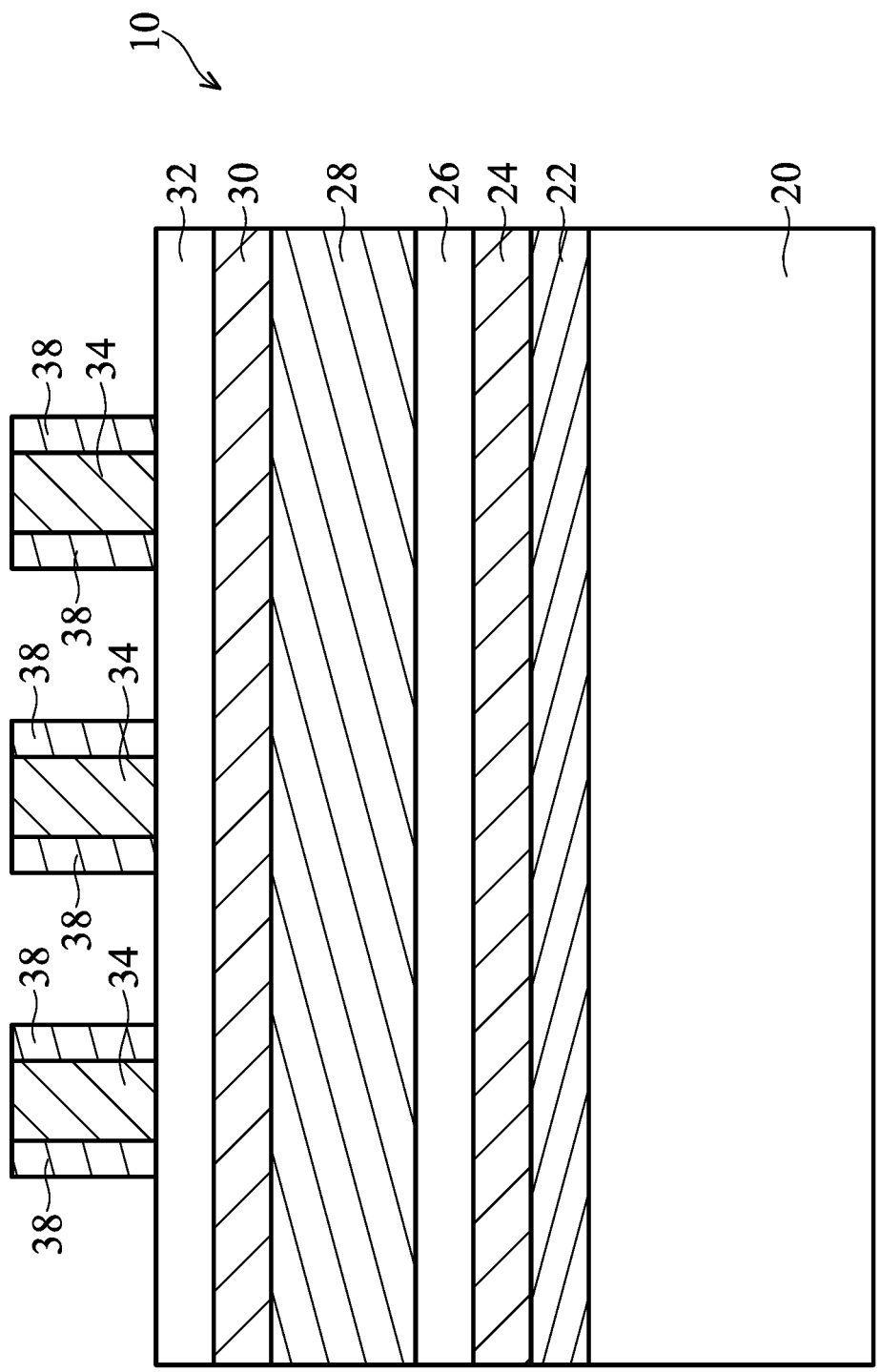
Figure 9:
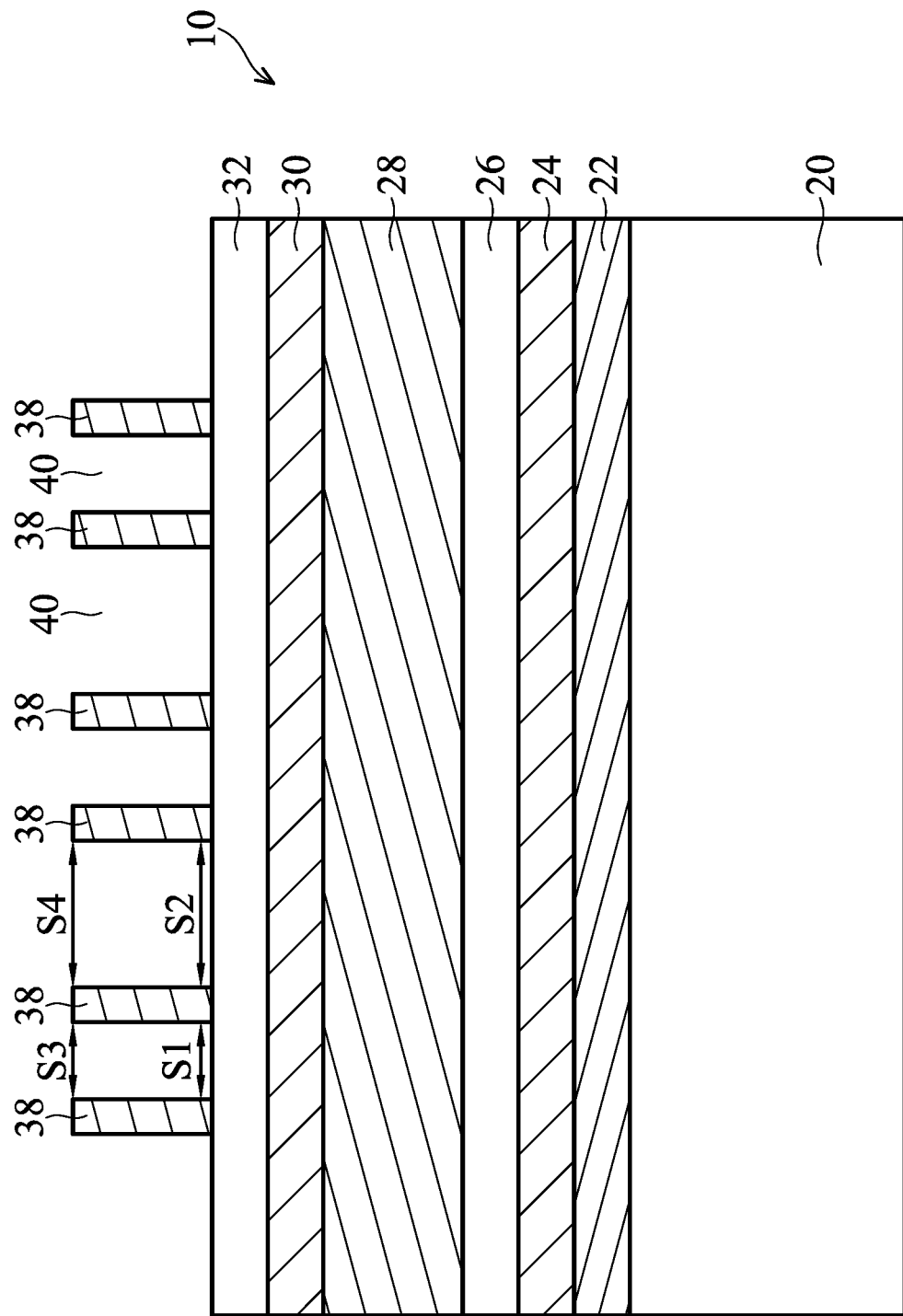

An anisotropic etching is then performed to remove the horizontal portions of spacer layer 36, while the vertical portions of spacer layer 36 remain, and are referred to as spacers 38, as shown in FIG. 8. The respective process is illustrated as process 206 in the process flow shown in FIG. 25. The resulting spacers 38 thus have a pitch equal to a half of the pitch of mandrels 34, and hence the corresponding process is referred to as a double-patterning process. Mandrels 34 are then removed, and the resulting structure is shown in FIG. 9. Openings 40 are thus formed between spacers 38.

Since spacer layer 36 is formed using process 100A in FIG. 2A, spacers 38 have a low stress also. With the low stress, spacers 38 may keep upright rather than being bended. For example, experiments performed on sample wafers revealed that if process is well controlled to form sample structures as shown in FIG. 9, and ratio S1/S2 is equal to 1.000, space ratio S3/S4 may be in the range between about 1.001 and about 1.03 (assuming S3 is the greater one) when the aspect ratio of spacers 38 are greater than about 45. As a comparison, if process 100B (FIG. 2B) is used, S3/S4 ratio may be as high as about 1.06. The bending of spacers 38 may be smaller than about 0.6 nm by adopting process 100A (FIG. 2A), even if the high aspect ratio of greater than 45 is adopted. If process 100B is adopted, the bending of spacers may be higher than 1.2 nm. In addition, with spacers 38 having a low stress, it is less likely to collapse even if the aspect ratio of spacers 38 is high, for example, higher than about 45. Furthermore, spacers 38 are less likely to collapse even if spacers 38 are thin. In accordance with some embodiments of the present disclosure, the thickness (measured in horizontal directions in FIG. 8), is in the range between about 40 Å and about 60 Å. The height of spacers 38 may be in the range between 600 Å and about 1500 Å. With these thickness and height, spacers 38 do not collapse.

Figure 10:
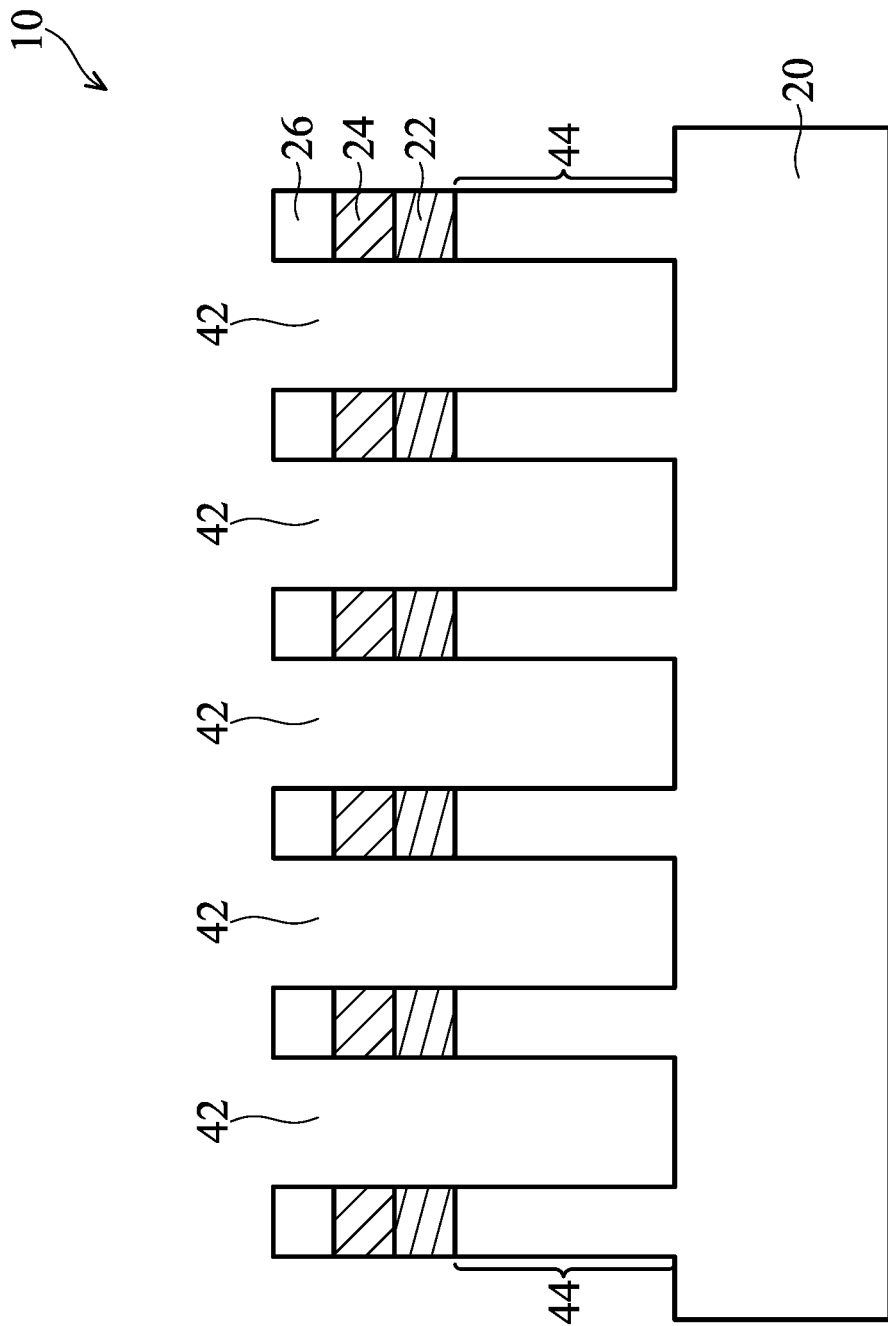

In accordance with some embodiments of the present disclosure, spacers 38 are used as an etching mask to etch the underlying layers 22, 24, 26, 28, 30, and 32. The details of the etching processes are not discussed herein. FIG. 10 illustrates a resulting structure, and layers 22, 24, and 26 are left, while the overlying layers 28, 30, and 32 (FIG. 9) are removed.

As illustrated in FIG. 10, the patterned layers 22, 24, and 26 are used as etching masks to etch the underlying semiconductor substrate 20, so that trenches 42 are formed. The respective process is illustrated as process 208 in the process flow shown in FIG. 25. In accordance with some embodiments, trenches 42 are formed as elongated trench strips. The portions of semiconductor substrate 20 between neighboring trenches 42 are referred to as semiconductor strips 44.

Figure 11:
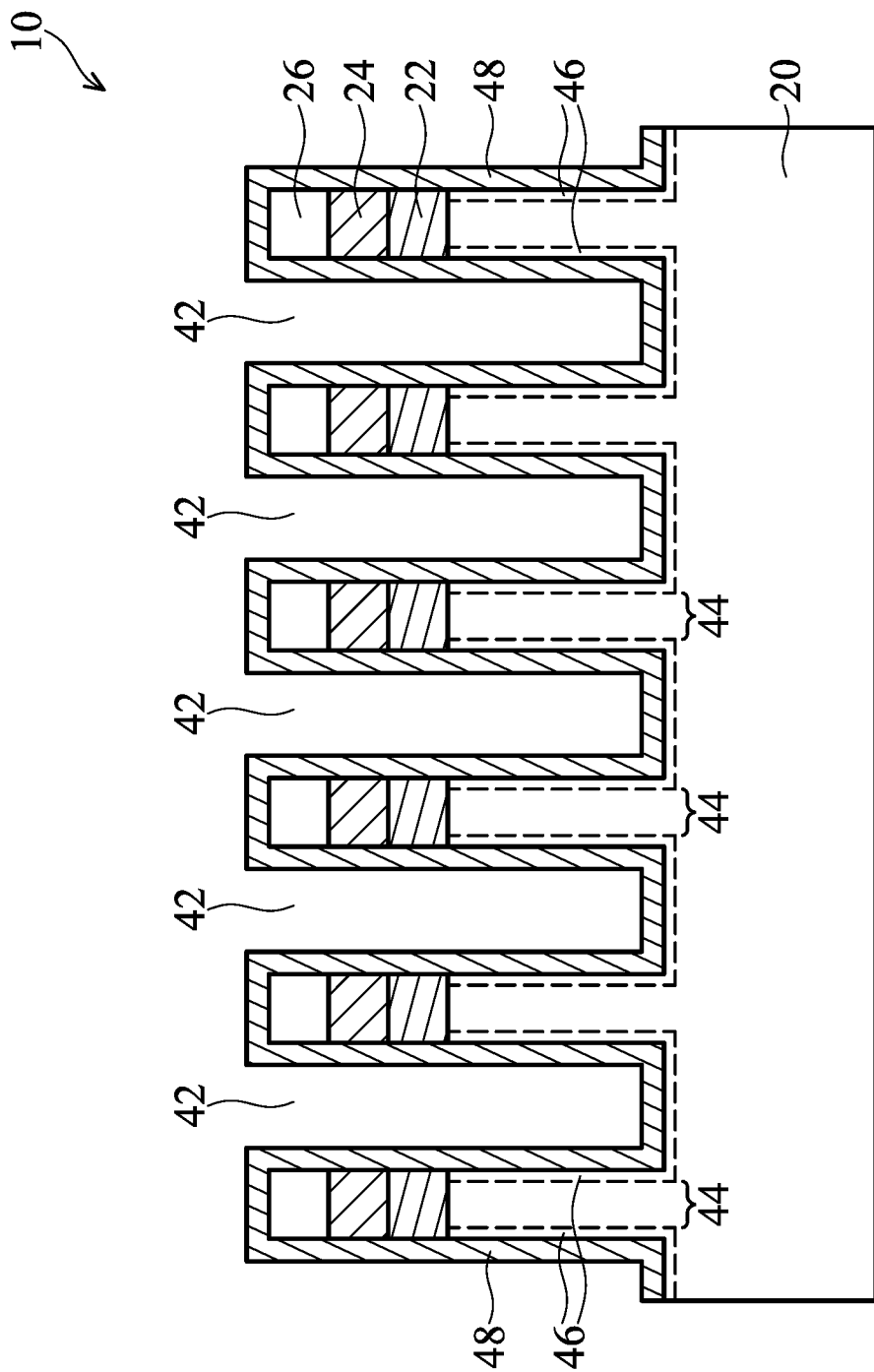

Referring to FIG. 11, in accordance with some embodiments, liner oxide 46 is formed at the bottoms of trenches 42 and extending on the sidewalls of semiconductor strips 44. In accordance with alternative embodiments, the formation of liner oxide 46 is skipped, and the subsequently formed silicon nitride layer is in contact with substrate 20. Liner oxide 46 may be a conformal layer, whose horizontal portions and vertical portions have thicknesses close to each other. The thickness of liner oxide 46 may be in the range between about 10 Å and about 100 Å. In accordance with yet other embodiments, liner oxide 46 is formed using a deposition process such as Sub Atmospheric Chemical Vapor Deposition (SACVD).

FIG. 11 also illustrates the deposition/formation of dielectric layer 48. The respective process is illustrated as process 210 in the process flow shown in FIG. 25. In accordance with some embodiments, dielectric layer 48 is a silicon nitride layer. To reduce the stress of silicon nitride layer 48 so that the undesirable bending of semiconductor strips 44 is reduced, and further to increase the density, silicon nitride layer 48 is formed using process 100A (FIG. 2A). In accordance with these embodiments, layer 48 corresponds to layer 104 in FIG. 1, and semiconductor strips 44, bulk substrate 20, and layers 22, 24, and 26 correspond to base layer 102 in FIG. 1.

Figure 12:
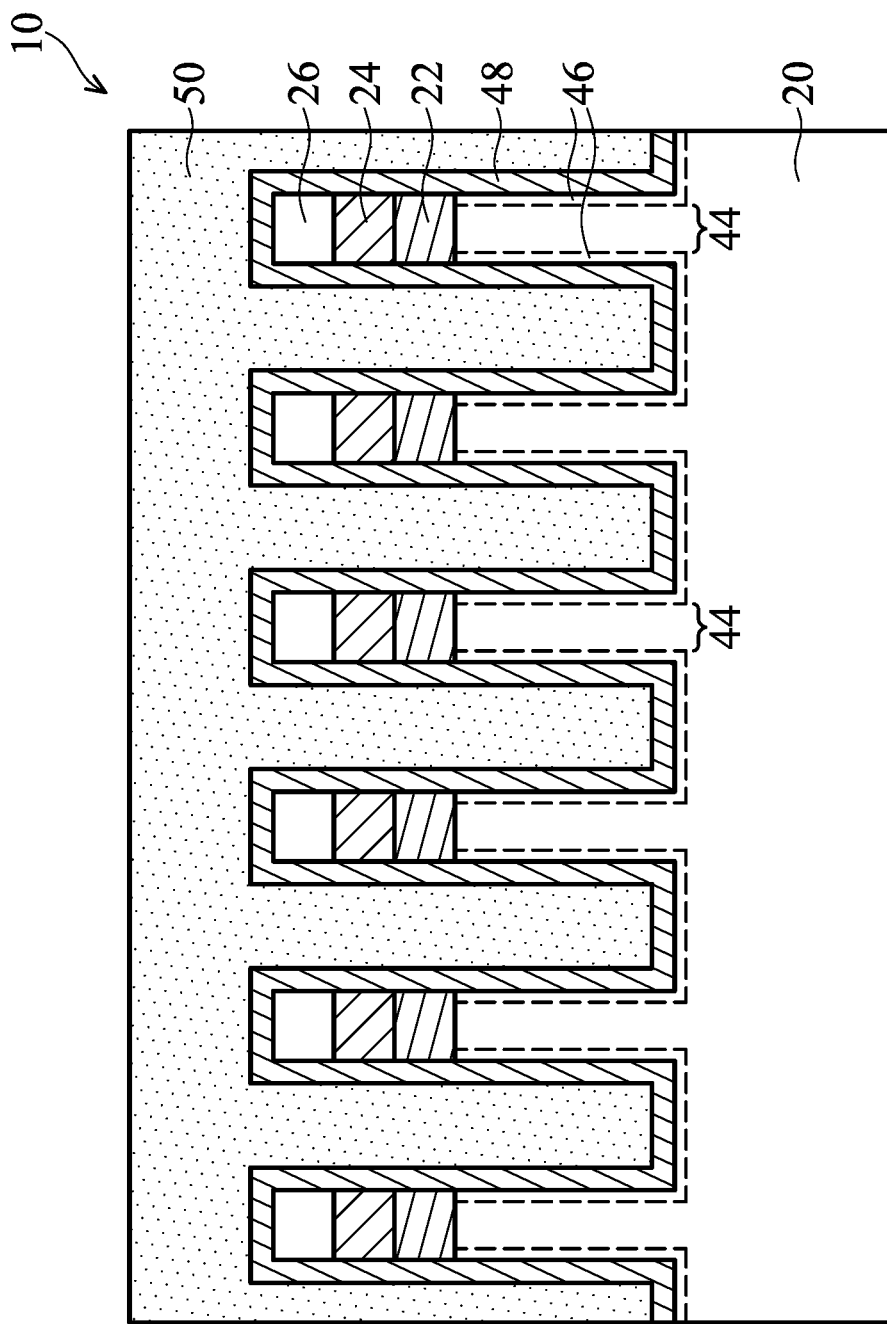

Dielectric material 50 is then formed to fill the remaining portions of trenches 42, resulting in the structure shown in FIG. 12. The formation method of dielectric material 50 may be selected from Flowable Chemical Vapor Deposition (FCVD), spin-on coating, CVD, ALD, High-Density Plasma Chemical Vapor Deposition (HDPCVD), LPCVD, and the like.

After dielectric material 50 is formed, an anneal/curing is performed, which converts flowable dielectric material 50 into a solid dielectric material. In accordance with some embodiments of the present disclosure, the anneal is performed in an oxygen-containing environment. The annealing temperature may be higher than about 200° C., for example, in a temperature range between about 200° C. and about 700° C. During the thermal treatment, an oxygen-containing process gas is conducted into the process chamber in which wafer 10 is placed. The oxygen-containing process gas may include oxygen ($O_2$), ozone ($O_3$), or combinations thereof. Steam ($H_2O$) may also be used, and may be used without oxygen ($O_2$) or ozone, or may be used in combination with oxygen ($O_2$) and/or ozone. As a result of the anneal, dielectric material 50 is cured and solidified. During the anneal, silicon nitride layer 48 protects semiconductor strips 44 and the bulk portion of substrate 20 from being oxidized. When silicon nitride layer 48 is formed using process 100A (FIG. 2A), the resulting silicon nitride layer 48 is dense (with a high density), and the hence it ability for blocking water and oxygen from penetrating-through is improved.

Figure 13:
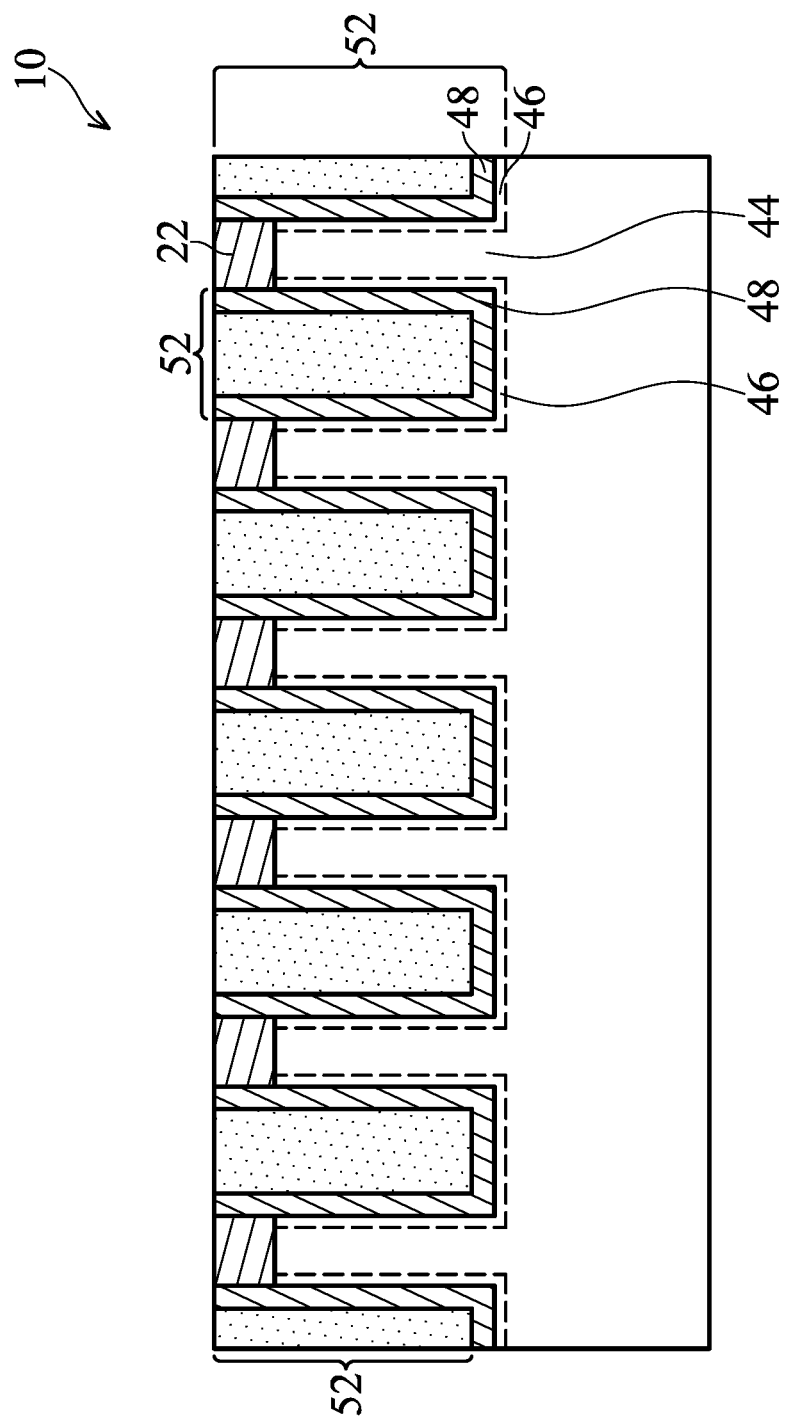

A planarization process such as a Chemical Mechanical Polish (CMP) process or a mechanical polish process is then performed, as shown in FIG. 13. STI regions 52 are thus formed, which include the remaining portions of liner oxide 46, silicon nitride layer 48, and dielectric regions 50. The respective process is illustrated as process 212 in the process flow shown in FIG. 25. Mask layer 24 (FIG. 12) may be used as the CMP stop layer, and hence the top surface of mask layer 24 is substantially level with the top surface of dielectric material 50. After the planarization, mask layer 24 is removed.

Figure 14A:
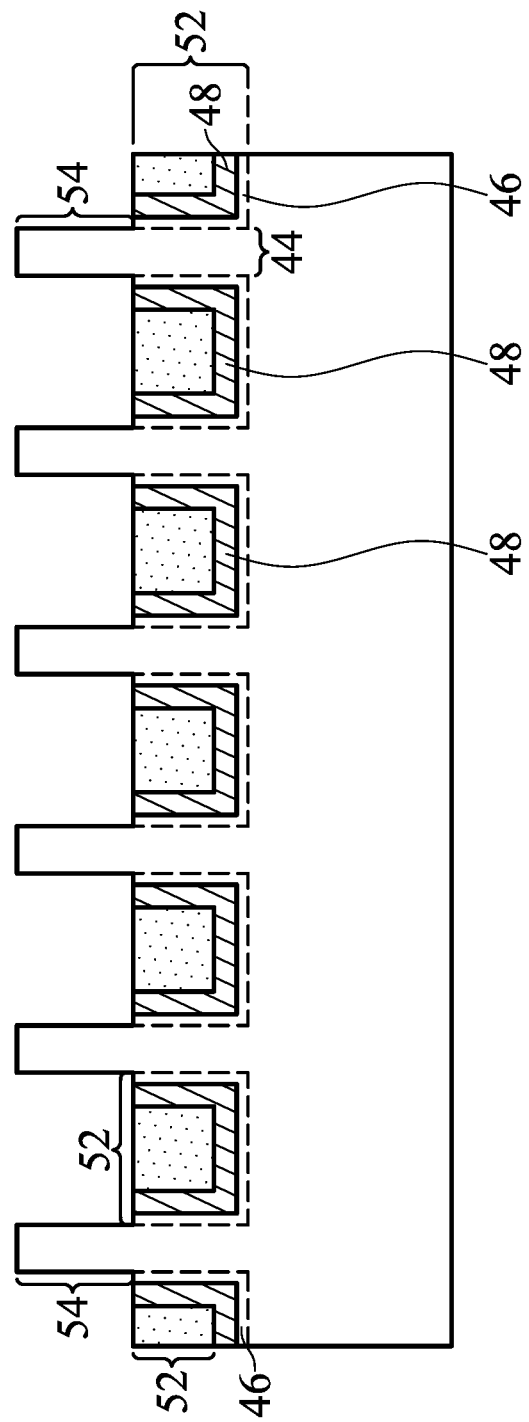
Figure 14B:
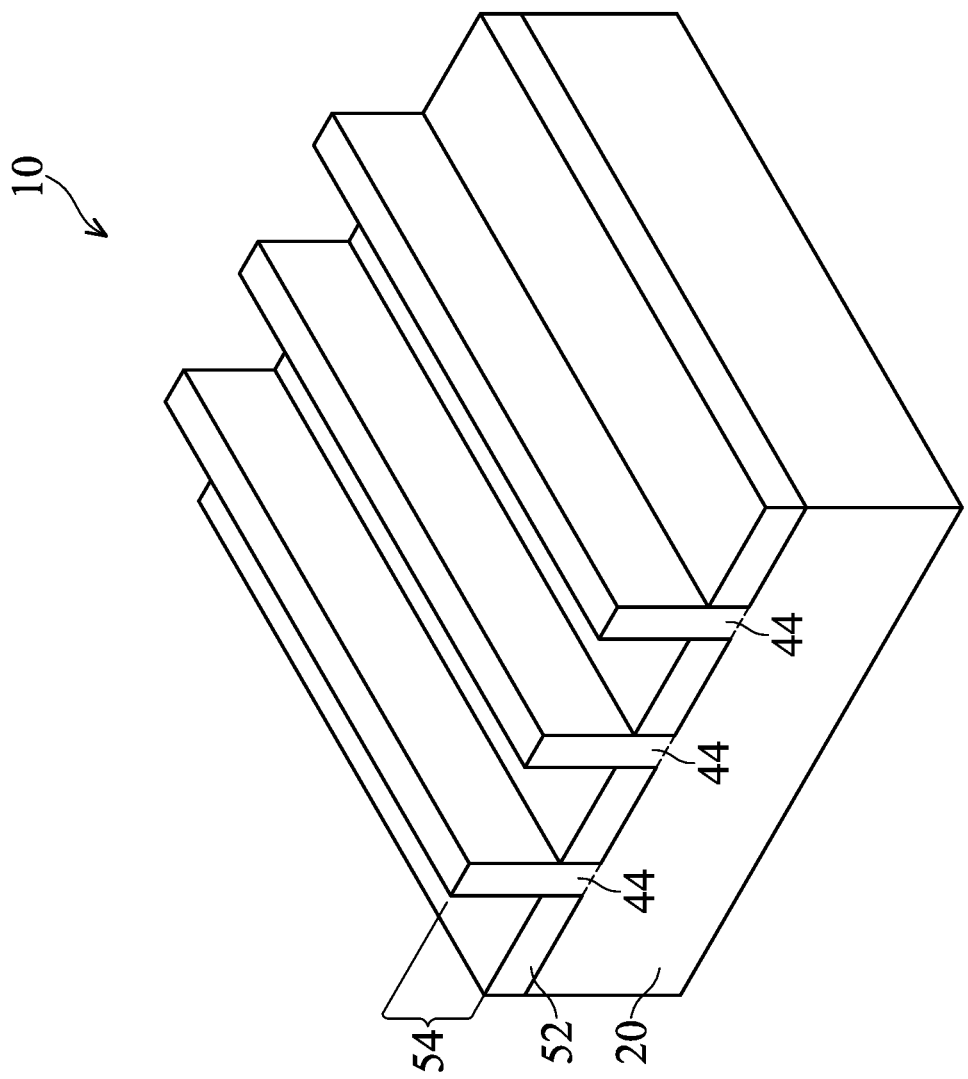

Next, the structure shown in FIG. 13 is used to form semiconductor fins through the recessing (etching back) of STI regions 52. Pad layer 22 is also removed in the recessing. The respective process is illustrated as process 214 in the process flow shown in FIG. 25. The resulting structure is shown in FIG. 14A. The recessing of STI regions 52 may be performed using a dry etch process or a wet etch process. In accordance with some embodiments of the present disclosure, the recessing of STI regions 52 is performed using a dry etch process, in which the process gases including $NH_3$ and HF are used. In accordance with alternative embodiments of the present disclosure, the recessing of STI regions 52 includes a wet etch process, in which the etchant solution includes a dilution HF solution. The portions of semiconductor strips 44 protruding out of the recessed STI regions 52 are referred to as semiconductor fins 54 herein after. FIG. 14B illustrates a perspective view of the structure shown in FIG. 14A. The sub layers inside STI regions 52 are not illustrated.

Figure 15:
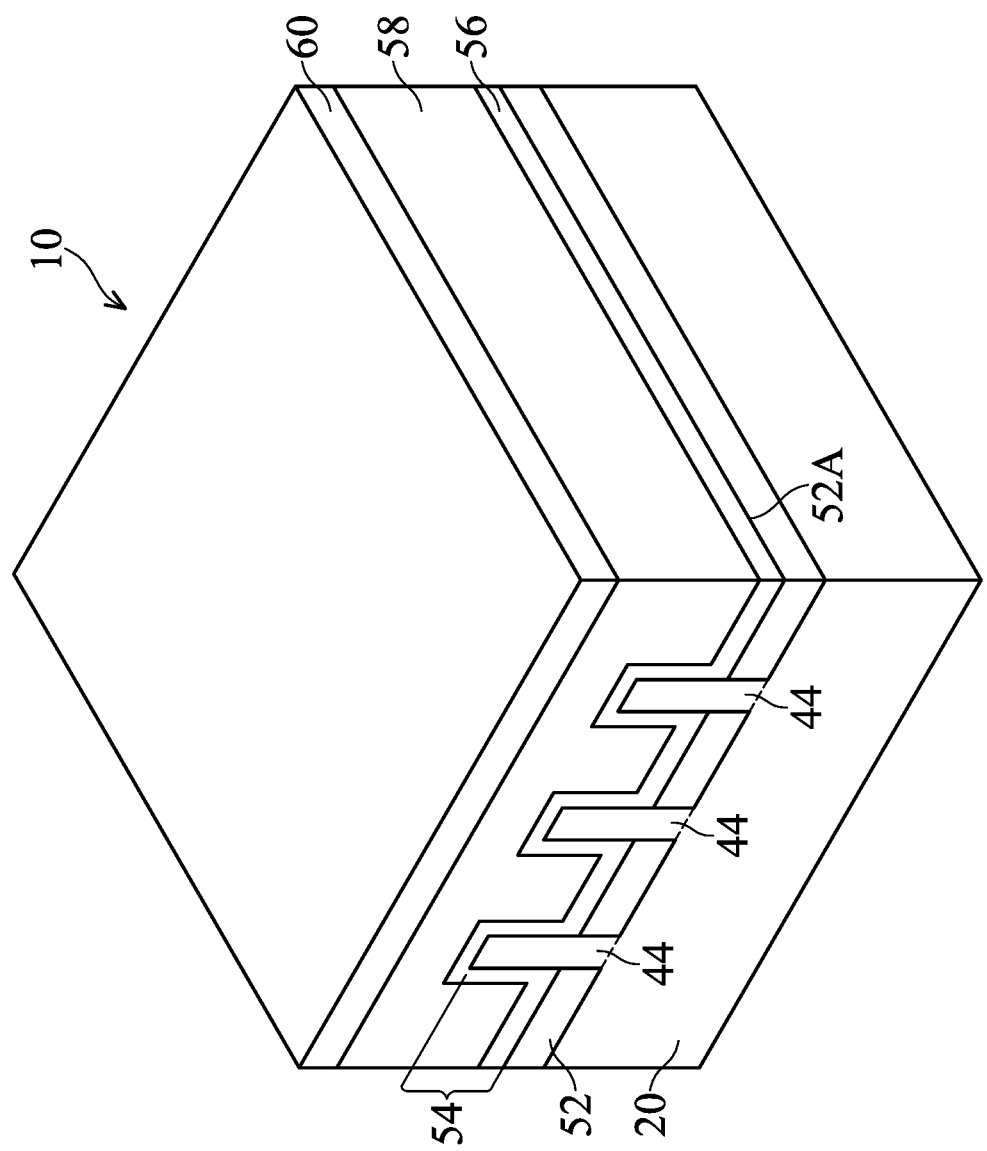

Referring to FIG. 15, dummy gate dielectric layer 56, dummy gate electrode layer 58, and hard mask 60 are formed. Layer 56 may be a silicon oxide layer formed using thermal oxidation or deposition. Layer 58 may be formed of polysilicon. Hard mask 60 may be formed of silicon nitride, silicon oxynitride, silicon carbo-nitride, or the like. Hard mask 60, when formed of silicon nitride, may be formed using process 100A (FIG. 2) in accordance with some embodiments to reduce stress, as will be discussed in subsequent processes. Next, layers 56, 58, and 60 are patterned in etching processes, resulting in dummy gate stacks 62 (FIG. 16) on the top surfaces and the sidewalls of (protruding) fins 54. The respective process is illustrated as process 216 in the process flow shown in FIG. 25. Dummy gate stacks 62 include dummy gate dielectrics 56, dummy gate electrodes 58 over dummy gate dielectrics 56, and hard masks 60 over dummy gate electrodes 58.

Next, gate spacers 64 are formed on the sidewalls of dummy gate stack 62. In accordance with some embodiments of the present disclosure, gate spacers 64 are formed of a dielectric material such as silicon oxide, silicon nitride, silicon carbo-nitride, or the like, and may have a single-layer structure or a multi-layer structure including a plurality of dielectric layers.

Figure 17:
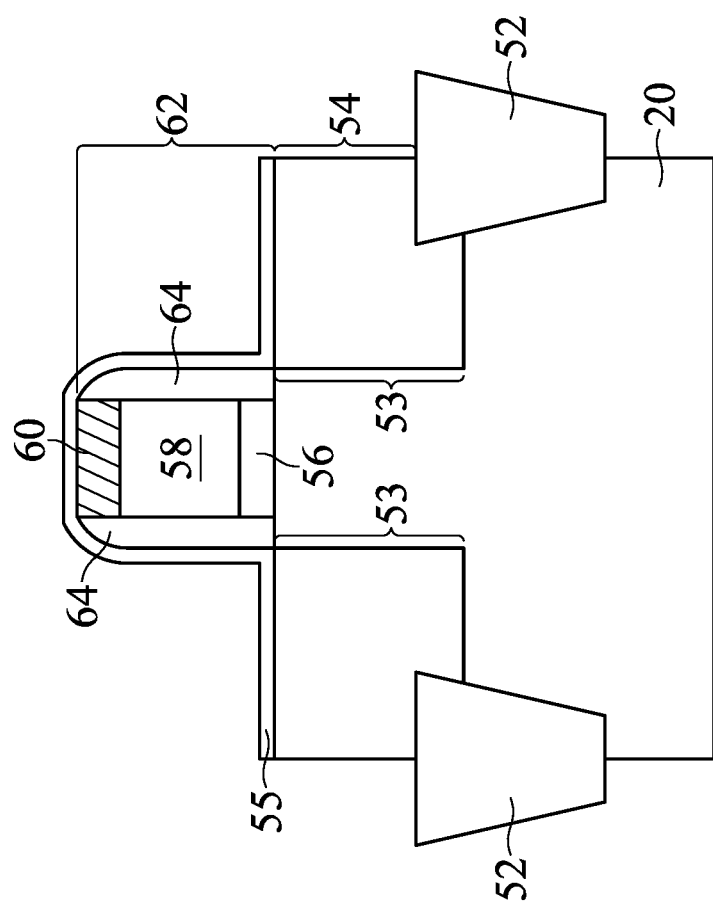
Figure 18:
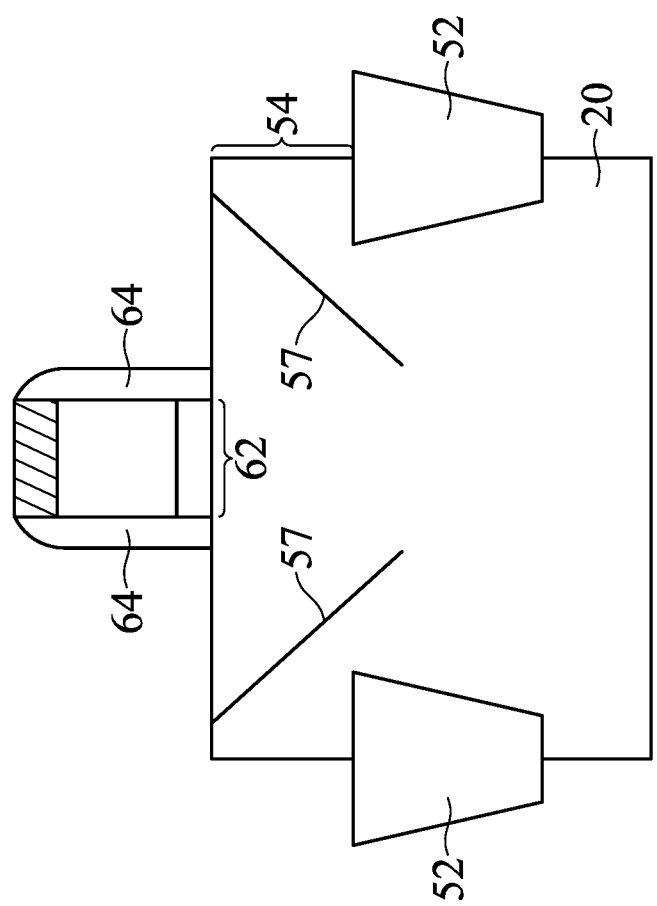

In the formation of transistors, some silicon nitride layers prefer lower stresses, and may be formed using process 100A (FIG. 2A), while other silicon nitride layers prefer higher stresses, and may be formed using process 100B (FIG. 2B). FIGS. 17 and 18 illustrate an example of a high-stress layer, which is used in the formation of dislocation planes. Dislocation planes will extend into source/drain regions. The dislocation planes may increase the strain in the channel regions of transistors, and hence may increase saturation currents of the transistors.

Referring to FIG. 17, a pre-amorphization implantation (PAI, also sometimes referred to as pre-amorphous implantation) is performed for forming PAI regions 53 in semiconductor fin 54. In accordance with some embodiments, silicon or germanium is implanted. In accordance with other embodiments, inert gases such as neon, argon, xenon, radon or a combination thereof is implanted.

Next, strained capping layer 55 is formed. The material of strained capping layer 55 may include silicon nitride, titanium nitride, oxynitride, oxide, SiGe, SiC, SiON, or combinations thereof. Strained capping layer 55 has a high stress. When strained capping layer 55 is formed of silicon nitride, process 100B (FIG. 2B) is used, so that the stress in strained capping layer 55 is high. The stress may be higher than about 1.0 GPa.

An anneal is then performed, for example, using Rapid Thermal Anneal (RTA), thermal spike RTA anneal, or other anneal methods. In accordance with some embodiments, the anneal is performed using spike RTA, with the annealing temperature between about 950° C. and about 1050° C., for about 3 ms to 5 seconds, for example. As a result of the anneal, PAI regions 53 as shown in FIG. 17 are recrystallized with a memorized stress obtained from strained capping layer 55. As the result of the annealing, dislocation planes 57 are formed, as shown in FIG. 18. Accordingly, a stress may be applied to the channel region of the resulting FinFET, so that the drive current of the FinFET is improved. Although illustrated as lines in the cross-sectional view shown in FIG. 18, dislocation planes 57 are planes that extend in the longitudinal direction of gate stack 62. After the anneal, the strained capping layer 55 (FIG. 17) is removed.

In subsequent processes, source/drain regions are formed. The respective process is illustrated as process 218 in the process flow shown in FIG. 25. It is appreciated that the illustrated gate stack may be used for forming isolation regions electrically and physically isolating the source/drain, the fin, and the well regions of neighboring FinFETs. The neighboring FinFETs may be of different types (p-FET or n-FET). Accordingly, the source/drain regions formed on opposite side of dummy gate stacks 62 may be of the same conductivity type or different conductivity types, which are formed in different process steps.

Figure 19:
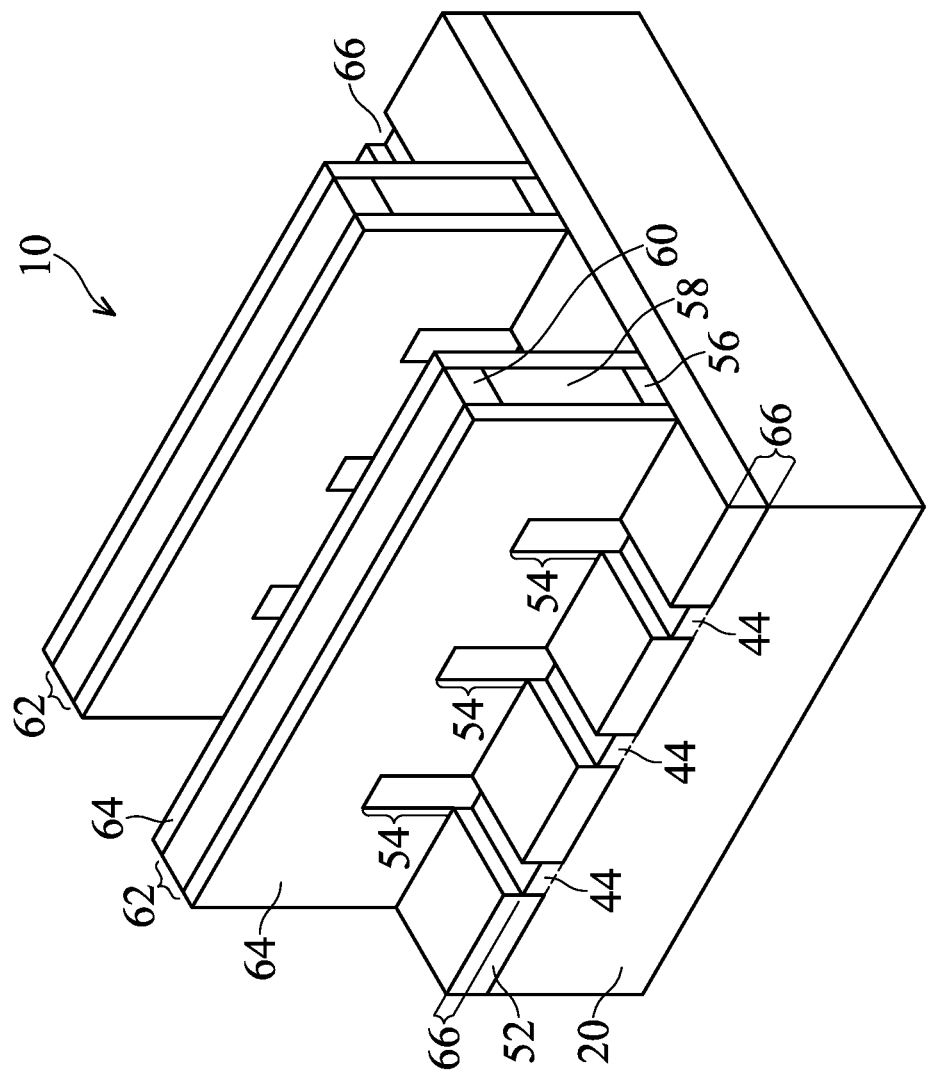

Referring to FIG. 19, an etching step (referred to as source/drain recessing hereinafter) is performed to etch the portions of protruding fins 54 that are not covered by dummy gate stacks 62 and gate spacers 64. The recessing may be anisotropic, and hence the portions of fins 54 directly underlying dummy gate stack 62 and gate spacers 64 are protected, and are not etched. Recesses 66 are accordingly formed between STI regions 52. Recesses 66 are located on the opposite sides of dummy gate stack 62. In the etching step, the upper portions of dislocation planes 57 (FIG. 18) are removed, and some bottom portions of dislocation planes 57 remain not etched.

Figure 20A:
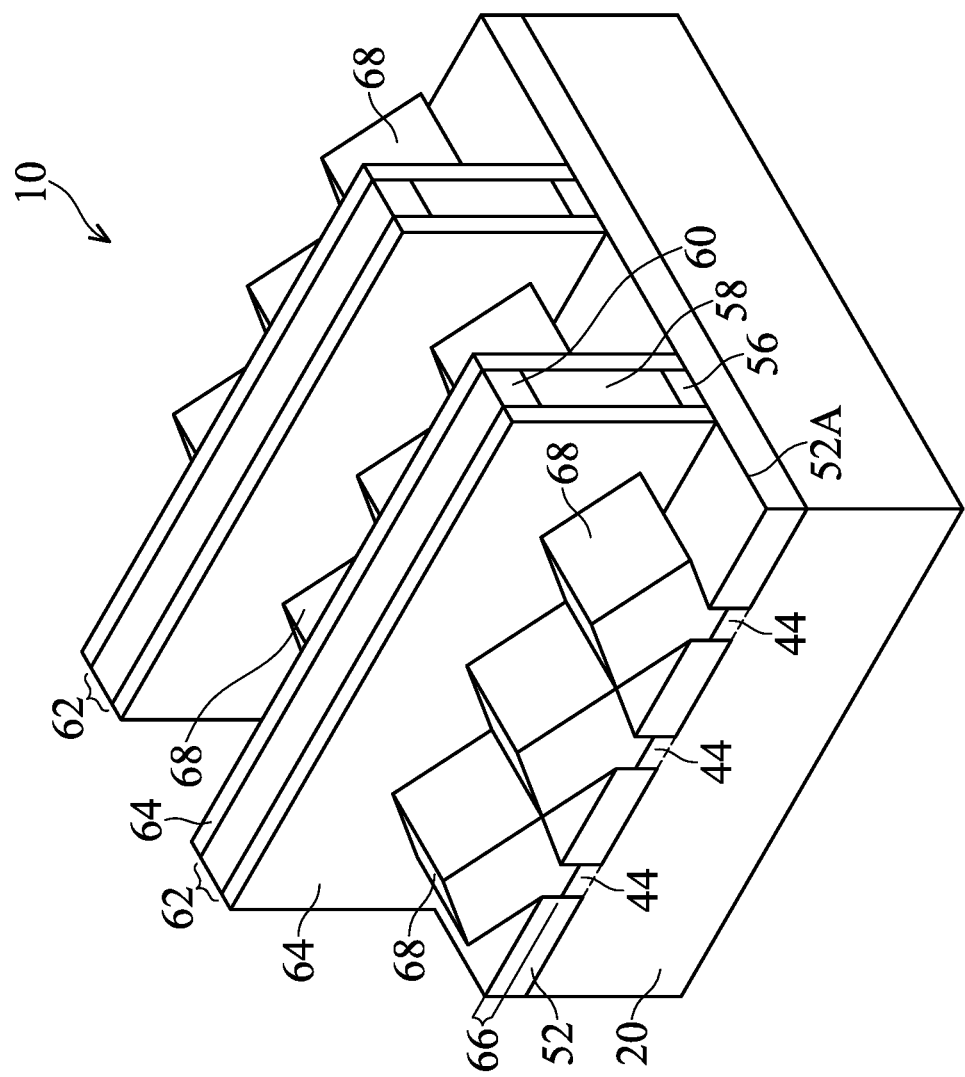

Next, epitaxy regions (source/drain regions) 68 are formed by selectively growing a semiconductor material in recesses 66, resulting in the structure in FIG. 20A. The removed portions of dislocation planes 57 (FIG. 18) that are removed in step in FIG. 19 will grow back starting from the remaining portions of the dislocation planes 57. In accordance with some embodiments, epitaxy regions 68 include silicon germanium or silicon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (Si-GeB) may be grown. Conversely, when the resulting FinFET is an n-type FinFET, silicon phosphorous (SiP) or silicon carbon phosphorous (SiCP) may be grown. In accordance with alternative embodiments of the present disclosure, epitaxy regions 68 are formed of a III-V compound semiconductor such as GaAs, InP, GaN, InGaAs, InAlAs, GaSb, AlSb, AlAs, AlP, GaP, combinations thereof, or multi-layers thereof. After epitaxy regions 68 fully fill recesses 66, epitaxy regions 68 start expanding horizontally, and facets may be formed.

After the epitaxy step, epitaxy regions 68 may be further implanted with a p-type or an n-type impurity to form source and drain regions, which are also denoted using reference numeral 68. In accordance with alternative embodiments of the present disclosure, the implantation step is skipped when epitaxy regions 68 are in-situ doped with the p-type or n-type impurity during the epitaxy to form source/drain regions. Epitaxy source/drain regions 68 include lower portions that are formed in STI regions 52, and upper portions that are formed over the top surfaces of STI regions 52.

Figure 16:
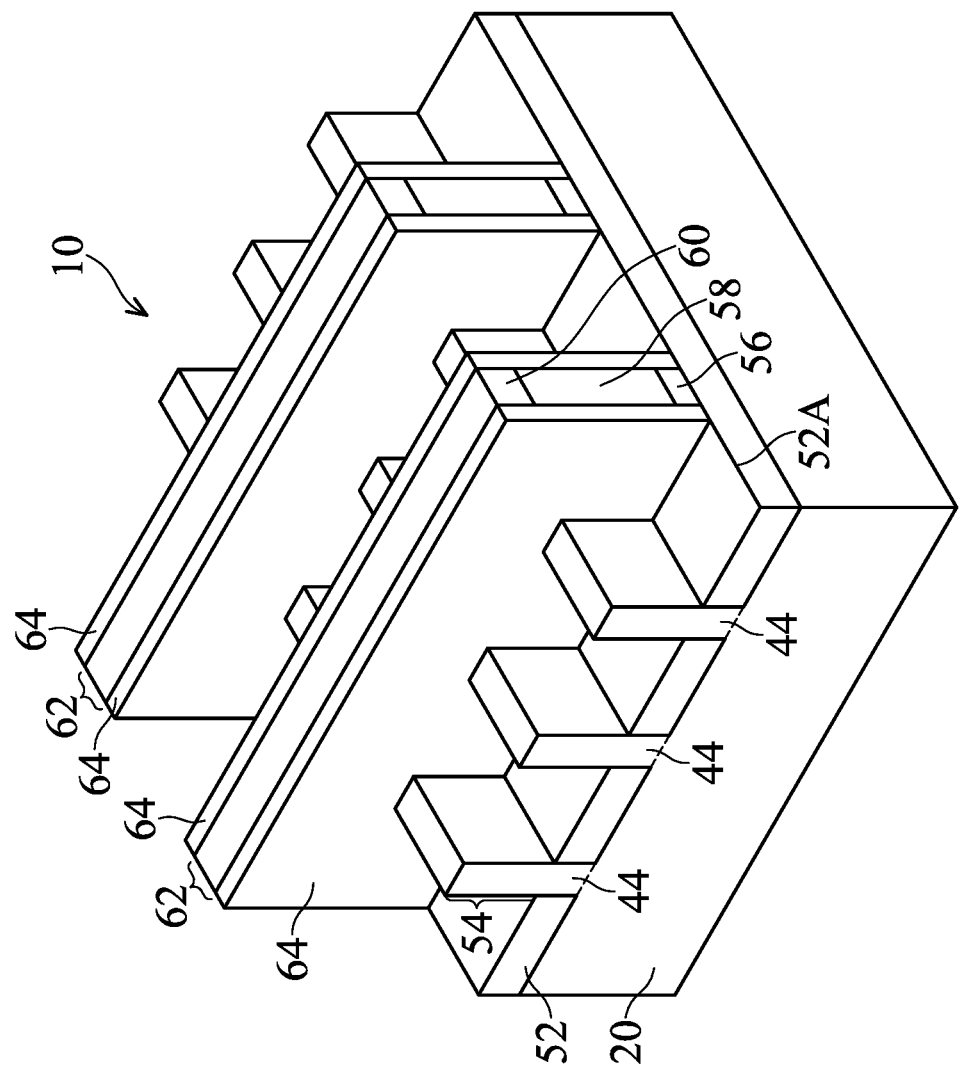
Figure 20B:
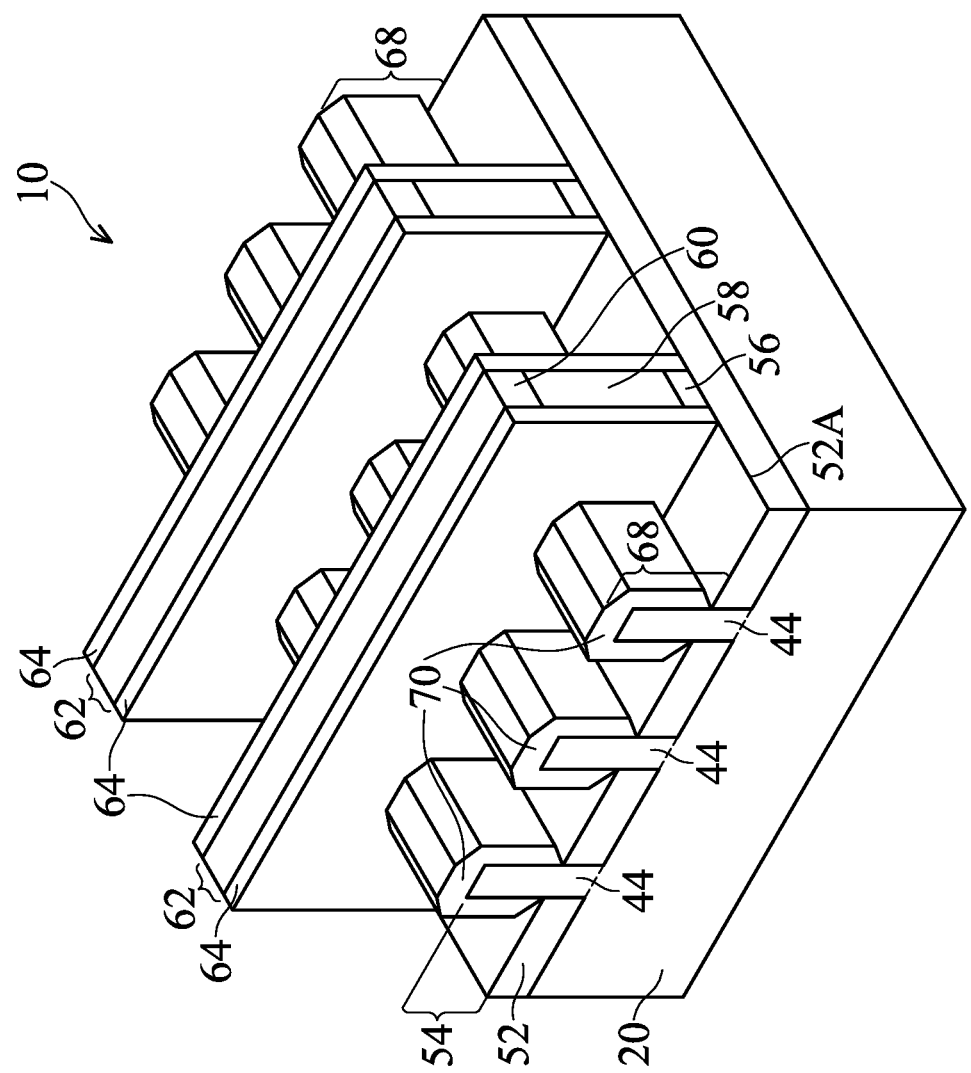

FIG. 20B illustrates the formation of source/drain regions 68 in accordance with alternative embodiments of the present disclosure. In accordance with these embodiments, the protruding fins 54 as shown in FIG. 16 are not recessed, and epitaxy regions 70 are grown on protruding fins 54. The material of epitaxy regions 70 may be similar to the material of the epitaxy semiconductor material 68 as shown in FIG. 20A, depending on whether the resulting FinFET is a p-type or an n-type FinFET. Accordingly, source/drains 68 include protruding fins 54 and the epitaxy regions 70. An implantation may be performed to implant an n-type impurity or a p-type impurity. Dislocation planes 57 (FIG. 18) will also grow into epitaxy regions 70.

Figure 21:
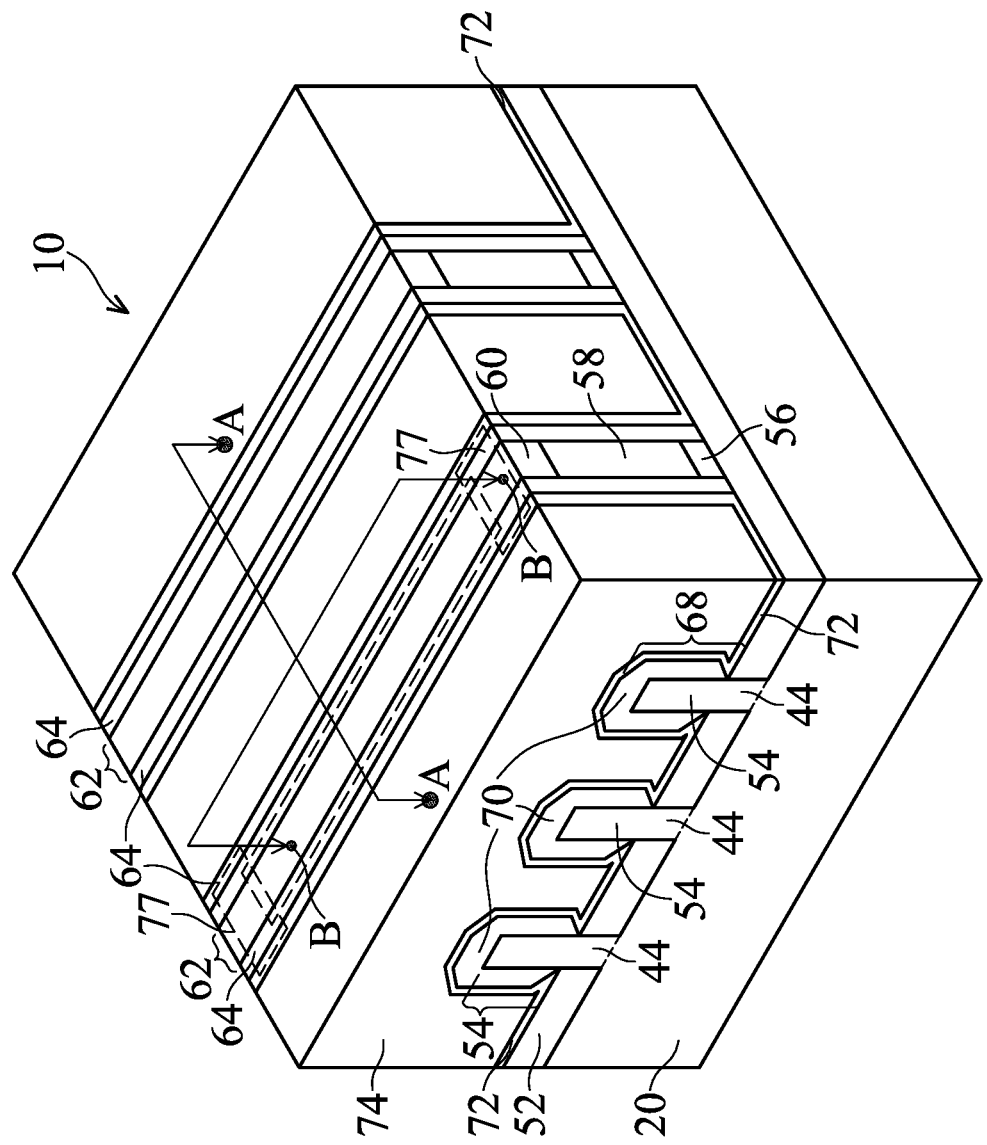

FIG. 21 illustrates a perspective view of the structure after the formation of Contact Etch Stop Layer (CESL) 72 and Inter-Layer Dielectric (ILD) 74. The respective process is illustrated as process 220 in the process flow shown in FIG. 25. CESL 72 may be formed of silicon nitride, silicon carbo-nitride, or the like. In accordance with some embodiments of the present disclosure, CESL 72 is formed of silicon nitride, silicon oxide, silicon carbide, or the like. CESL 72 may be formed using a conformal deposition method such as ALD or CVD, for example. In accordance with some embodiments, CESL 72 is a silicon nitride layer, which is formed using process 100A as shown in FIG. 2A. In accordance with these embodiments, CESL 72 corresponds to layer 104 in FIG. 1, and sourced/drain regions 68, gate spacers 64, etc. correspond to base layer 102 in FIG. 1.

By adopting process 100A, CESL 72 is denser, and is more resistance to the subsequent etching for forming contact plugs, and hence the lateral etching is reduced. Also, CESL 72 may be made thinner without compromising their etch-stop function. Being thinner, CESL 72 introduces smaller parasitic capacitance between source/drain regions and neighboring gate electrodes. In accordance with some embodiments of the present disclosure, CESL 72 is thinner than about 4 nm, and the thickness may be in the range between about 1 nm and about 3 nm.

Figure 22A:
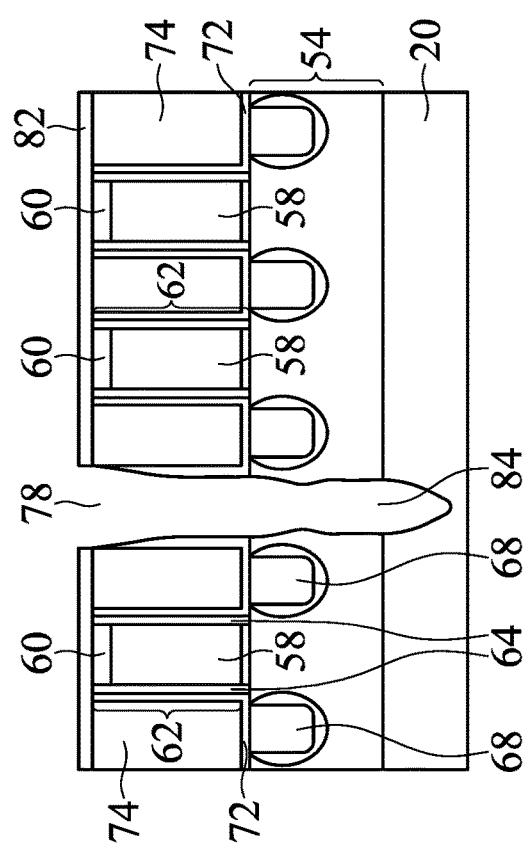
Figure 22B:
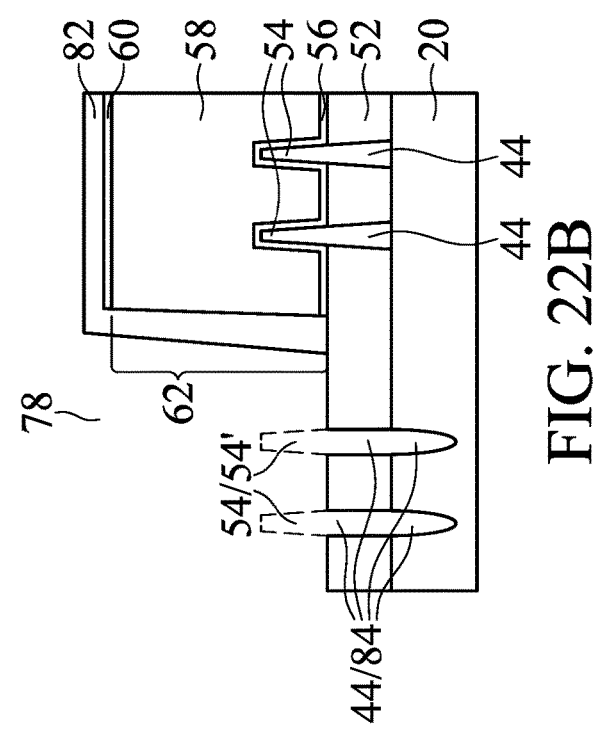
Figure 25:
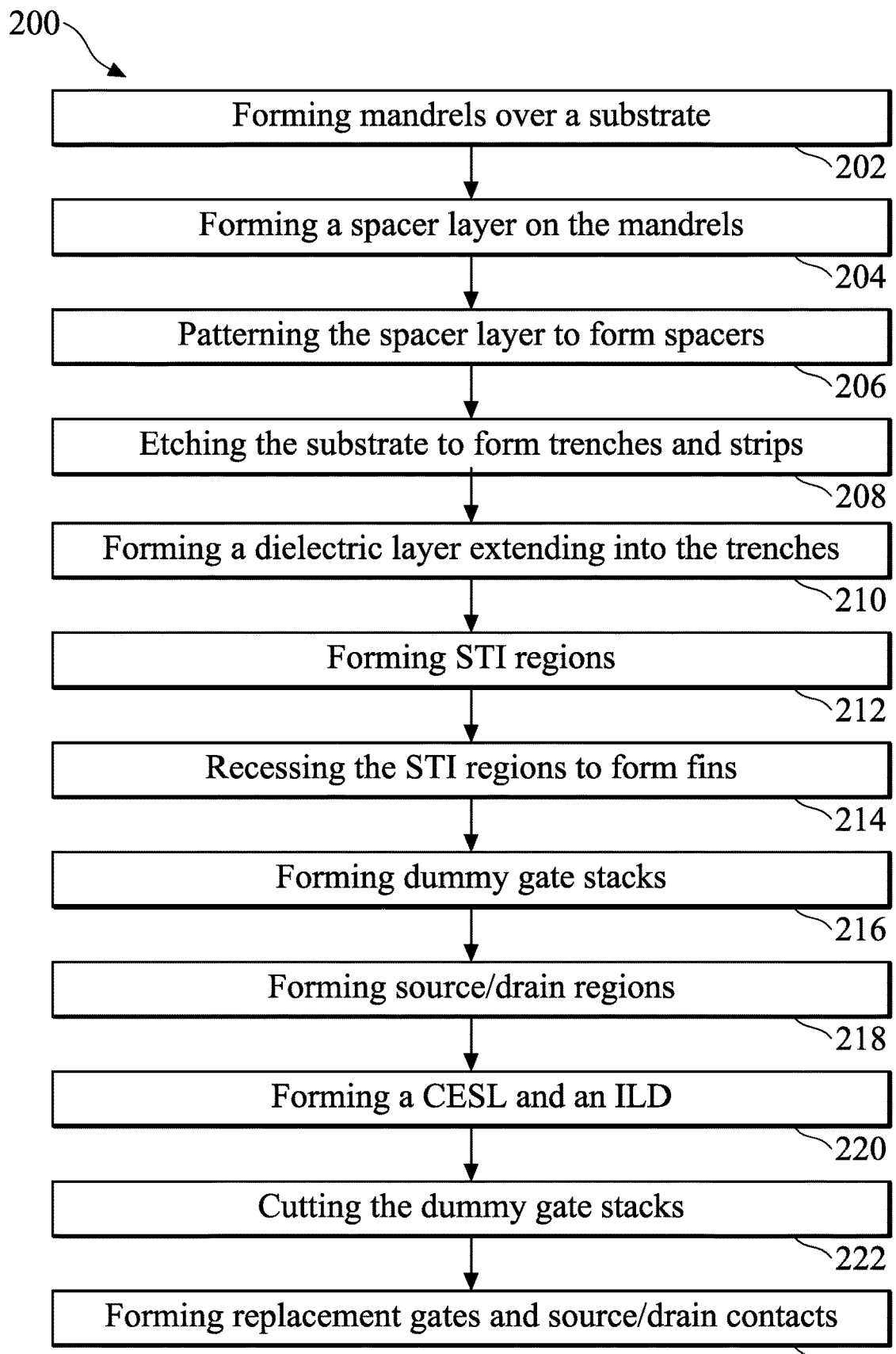
FIG. 25 illustrates a process flow for forming FinFETs in accordance with some embodiments.

FIGS. 22A, 22B, 23A, and 23B illustrate the cutting process of dummy gate stacks 62 and fins 54, which process is also referred to as a cut-PODE process, wherein "PODE" stands for "Poly on OD Edge." The respective process is illustrated as process 222 in the process flow shown in FIG. 25. The cross-sectional view shown in FIGS. 22A and 23A are obtained from the plane same as the plane containing line A-A in FIG. 21. The cross-sectional views shown in FIGS. 22B and 23B are obtained from the plane same as the plane containing line B-B in FIG. 21. In the cut-PODE process, an etching process is performed to remove the portions of dummy gate stacks 62 in the illustrated region 77 in FIG. 21, followed by filling a dielectric material into the resulting trench. The cut-PODE process has two functions. Firstly, since dummy gate stacks 62 are long strips, by cutting them into shorter portions, the short portions of the dummy gate stacks 62 may be replaced to form the replacement gate electrodes of multiple transistors. Secondly, in the cut-PODE process, the semiconductor fins that are exposed through the trench may also be etched, so that the filled dielectric materials may also extend into the underlying fins, and may extend into the bulk substrate 20. Accordingly, the filled dielectric material may electrically and physically isolate the fins and substrates of neighboring FinFETs, and the source/drain regions on one side (for example, the illustrated left side in FIG. 21) of dummy gate stack 62 is isolated from the source/drain regions on the other side (for example, the illustrated right side in FIG. 21). Furthermore, with the cut-PODE process, the source/drain regions on the opposite sides of a dummy gate stack may be of opposite conductivity type, with one belonging to a p-type FinFET, and the other belonging to an n-type FinFET. This significantly reduces the distance between neighboring p-type and n-type FinFETs, and the device density is improved.

FIGS. 22A, 22B, 23A, and 23B illustrate the cutting process of dummy gate stacks 62 and fins 54, which process is also referred to as a cut-PODE process, wherein "PODE" stands for "Poly on OD Edge." The respective process is illustrated as process 222 in the process flow shown in FIG. 25. The cross-sectional view shown in FIGS. 22A and 23A are obtained from the plane same as the plane containing line A-A in FIG. 21. The cross-sectional views shown in FIGS. 22B and 23B are obtained from the plane same as the plane containing line B-B in FIG. 21. In the cut-PODE process, an etching process is performed to remove the portions of dummy gate stacks 62 in the illustrated region 76 in FIG. 21, followed by filling a dielectric material into the resulting trench. The cut-PODE process has two functions. Firstly, since dummy gate stacks 62 are long strips, by cutting them into shorter portions, the short portions of the dummy gate stacks 62 may be replaced to form the replacement gate electrodes of multiple transistors. Secondly, in the cut-PODE process, the semiconductor fins that are exposed through the trench may also be etched, so that the filled dielectric materials may also extend into the underlying fins, and may extend into the bulk substrate 20. Accordingly, the filled dielectric material may electrically and physically isolate the fins and substrates of neighboring FinFETs, and the source/drain regions on one side (for example, the illustrated left side in FIG. 21) of dummy gate stack 62 is isolated from the source/drain regions on the other side (for example, the illustrated right side in FIG. 21). Furthermore, with the cut-PODE process, the source/drain regions on the opposite sides of a dummy gate stack may be of opposite conductivity type, with one belonging to a p-type FinFET, and the other belonging to an n-type FinFET. This significantly reduces the distance between neighboring p-type and n-type FinFETs, and the device density is improved.

FIGS. 22A and 22B illustrate the cross-sectional view showing a first etching step to etch the portion of dummy gate stack 62 in regions 77 (FIG. 21), followed by filling silicon nitride layer 82 into the resulting trenches. Next, the portion of dummy gate stack 62 in FIG. 21 is etched in a second etching step, resulting in trench 78 as shown in FIGS. 22A and 22B. The etchings stop on top of STI regions 52 (FIG. 22B). Silicon nitride layer 82 may be formed of silicon nitride. In accordance with some embodiments of the present disclosure, silicon nitride layer 82 is formed using process 100A as shown in FIG. 2A, so that the stress in silicon nitride layer 82 is reduced.

As shown in FIG. 22B, after the second etching, semiconductor fins 54 (illustrated using dashed lines and marked as 54') are exposed. Next, semiconductor fins 54' are etched, and the underlying semiconductor strips 44 (also shown as dashed) are revealed, and are also etched, resulting in trenches 84 to be formed. Trenches 84 may extend into fins 54 (FIG. 22A) to cut the fins into separate portions. Trenches 84 may also extend into the bulk portion of substrate 20.

Referring to FIGS. 23A and 23B, dielectric layer 86 is deposited to fill into the trenches 78 and 84 as shown in FIGS. 22A and 22B. Dielectric layer 86 includes horizontal portions over silicon nitride layer 82, and vertical portion extending into trenches 78 and 84 (FIG. 22B). In accordance with some embodiments of the present disclosure, dielectric layer 86 is formed of silicon nitride, and is formed using process 100A (FIG. 2A). Accordingly, the stress in dielectric layer 86 is reduced. The portions in the trenches form isolation regions 86A for isolating neighboring FinFETs.

When dielectric layer 86 is formed using process 100A (FIG. 2A), dielectric layer 86 corresponds to layer 104 in FIG. 1, and the layers underlying dielectric layer 86 correspond to base layer 102 in FIG. 1. By adopting process 100A to form dielectric layer 86, dielectric layer 86 has a reduced stress, which may be a neutral or substantially neutral stress. The stress in the horizontal portions of dielectric layer 86 affects the threshold voltage in neighboring FinFETs, causing the drift in threshold voltages. For example, if the threshold voltage immediately neighboring no-stress silicon nitride layers have threshold Vt0, due to the stress in silicon nitride layers 82 and 86, the threshold voltages may shift to Vt1, and the threshold-voltage shift $\Delta Vt$ is equal to (Vt1−Vt0). If silicon nitride layers 82 and 86 are formed using process 100B (FIG. 2B), the stress in the silicon nitride layers 82 and 86 are high, and the threshold-voltage shift $\Delta Vt$ may be between about 50 mV and about 100 mV. When silicon nitride layers 82 and 86 are formed using process 100A (FIG. 2A), the stress in the silicon nitride layers 82 and 86 are low, and the threshold-voltage shift $\Delta Vt$ may be reduced to smaller than 50 mV. It is appreciated that the threshold-voltage shift $\Delta Vt$ is affected by other factors such as whether the FinFETs are in device-sparse (iso) regions or device-dense regions, and hence is not controllable. Accordingly, it is desirable to have lower threshold voltage shift. In accordance with some embodiments of the present disclosure, by adopting process 100A to form silicon nitride layers 82 and 86, the threshold voltage shift $\Delta Vt$ is reduced.

Figure 24:
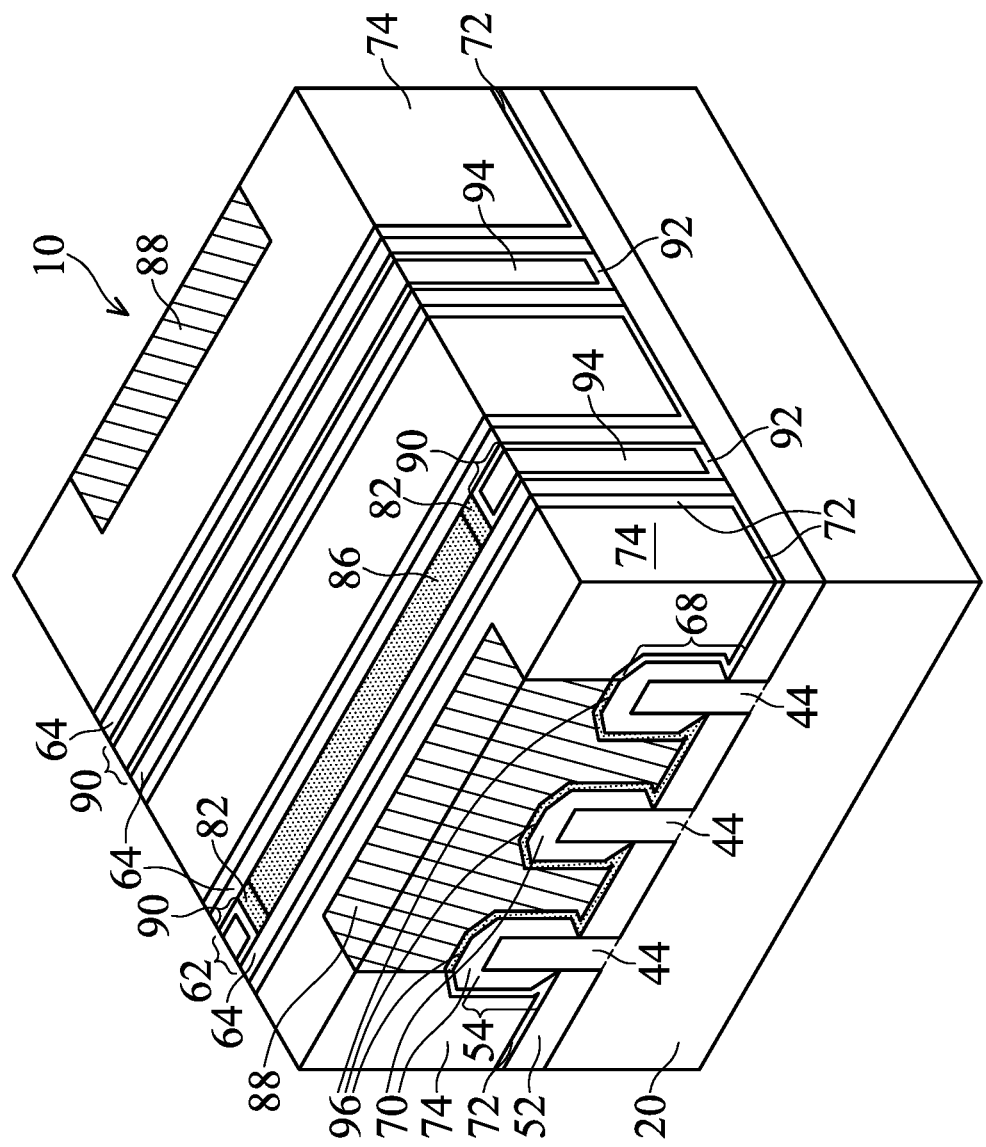

FIG. 24 illustrates the formation of replacement gates 90. The respective process is illustrated as process 224 in the process flow shown in FIG. 25. The formation process includes removing the remaining portions of dummy gate stack 62 in FIG. 21 to form trenches, and forming replacement gates 90 in the resulting trenches. Replacement gates 90 include gate dielectrics 92 and metal gate electrodes 94. Isolation regions 82 and 86 separate the replacement gates 90.

Also refer to FIG. 24, some portions of ILD 74 and CESL 72 are removed to form contact openings, followed by siliciding the exposed portions of source/drain regions 68 to form source/drain silicide regions 96, and filling a conductive material such as tungsten to form source/drain contact plugs 88. The respective process is also illustrated as process 224 in the process flow shown in FIG. 25. In the formation of the contact openings, CESL 72 is used as an etch stop layer. A dense CESL 72, which is formed adopting process 100A in FIG. 2A, is more effective in stopping the etching without the need of increasing the thickness of CESL 72. Furthermore, when etching CESL 72 to reveal the underlying source/drain regions 68, the lateral etching of the portions of CESL 72 directly underlying ILD 74 is reduced.

Since process 100A in FIG. 2A has higher manufacturing cost and lower throughput, the process 100A and 100B may be selected in accordance with some embodiments to achieve optimum results without the unnecessarily increase in the manufacturing cost. For example, if smaller stress is beneficial, process 100A is used to form the corresponding silicon nitride layer. On the other hand, if a high stress is beneficial, such as in the capping layer 55 in FIG. 17, process 100B is used.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The embodiments of the present disclosure have some advantageous features. By adopting process 100A to form some silicon nitride layers, the undesirable stress may be reduced, resulting in the improvement in device performance and uniformity. Also, processes 100A and 100B may be selected depending on different requirements to maximize the benefit in device performance and uniformity and minimize manufacturing cost.

In accordance with some embodiments of the present disclosure, a method includes placing a wafer into a process chamber, and depositing a silicon nitride layer on a base layer of the wafer. The process of depositing the silicon nitride layer includes introducing a silicon-containing precursor into the process chamber, purging the silicon-containing precursor from the process chamber, introducing hydrogen radicals into the process chamber, purging the hydrogen radicals from the process chamber; introducing a nitrogen-containing precursor into the process chamber, and purging the nitrogen-containing precursor from the process chamber. In an embodiment, the hydrogen radicals are introduced after the silicon-containing precursor is introduced and before the nitrogen-containing precursor is introduced. In an embodiment, no silicon-containing precursor is introduced between the introducing the hydrogen radicals and the introducing the nitrogen-containing precursor. In an embodiment, no nitrogen-containing precursor is introduced between the introducing the hydrogen radicals and the introducing the silicon-containing precursor. In an embodiment, the method further comprises: forming mandrels on the wafer, wherein the silicon nitride layer is formed as a spacer layer contacting sidewalls and top surfaces of the mandrels; performing an anisotropic etching to remove horizontal portions of the silicon nitride layer, with vertical portions of the silicon nitride layer left as spacers; removing the mandrels; and etching the base layer using spacers as an etching mask. In an embodiment, the method further comprises: etching a semiconductor substrate in the wafer to form trenches and semiconductor strips separated from each other by the trenches, wherein the silicon nitride layer extends into the trenches as a liner dielectric layer; and filling a dielectric material over bottom portions of the silicon nitride layer in the trenches; and removing excess portions of the dielectric material and the silicon nitride layer to form STI regions. In an embodiment, the method further comprises: etching a portion of a dummy gate stack to form a trench, wherein the dummy gate stack is formed on sidewalls and a top surface of a semiconductor fin; and etching exposed portions of the semiconductor fin to extend the trench and to separate portions of the semiconductor fin, wherein the silicon nitride layer is filled into the trench. In an embodiment, the method further comprises forming source/drain regions on a side of a gate stack, wherein the silicon nitride layer is formed as a contact etch stop layer; and forming an inter-layer dielectric over the contact etch stop layer.

In accordance with some embodiments of the present disclosure, a method comprises forming mandrels over a semiconductor substrate of a wafer; forming a silicon nitride layer on the mandrels using ALD in a process chamber, the forming the silicon nitride layer comprising: generating hydrogen radicals; and conducting the hydrogen radicals into the process chamber; etching the silicon nitride layer to form spacers on sidewalls of the mandrels; removing the mandrels; and transferring patterns of the spacers into the semiconductor substrate. In an embodiment, the forming the silicon nitride layer further comprises: before the hydrogen radicals are conducted, conducting a silicon-containing precursor into the process chamber, wherein the hydrogen radicals react with portions of the silicon-containing precursor that are left on the wafer after the purging the silicon-containing precursor; and purging the silicon-containing precursor from the process chamber. In an embodiment, the method further comprises, after the purging the hydrogen radicals, conducting a nitrogen-containing precursor into the process chamber; and purging the nitrogen-containing precursor. In an embodiment, the method further comprises forming an additional silicon nitride layer on the wafer, wherein the forming the additional silicon nitride layer is performed using ALD, and no hydrogen radicals are introduce during the forming the additional silicon nitride layer. In an embodiment, the method further comprises generating the hydrogen radicals using remote plasma. In an embodiment, the hydrogen radicals comprises $H_2^*$ radicals. In an embodiment, the silicon-containing precursor comprises DCS. In an embodiment, the method further includes after the hydrogen radicals are conducted into the process chamber, purging the hydrogen radicals from the process chamber; after the hydrogen radicals are purged, introducing a nitrogen-containing precursor into the process chamber; and purging the nitrogen-containing precursor from the process chamber.

In accordance with some embodiments of the present disclosure, a method comprises forming a silicon nitride layer comprising placing a wafer into a process chamber; introducing a silicon-containing precursor into the process chamber, wherein the silicon-containing precursor comprises a halogen element; purging the silicon-containing precursor from the process chamber; introducing a precursor to remove parts of the halogen element from portions of the silicon-containing precursor attached to the wafer; introducing a nitrogen-containing precursor into the process chamber to react with the silicon-containing precursor that has reduced amount of the halogen element; and purging the nitrogen-containing precursor from the process chamber. In an embodiment, the halogen element comprises chlorine, fluorine, bromine, or iodine. In an embodiment, the precursor comprises hydrogen in a form of radicals. In an embodiment, the precursor is free from silicon, and is free from nitrogen.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
placing a wafer into a process chamber;
depositing a first silicon nitride layer over the wafer, the depositing comprising:
depositing a first sub layer of the first silicon nitride layer;

performing a first treatment process on the first sub layer using hydrogen as a process gas; and after the first treatment process, depositing a second sub layer of the first silicon nitride layer over the first sub layer;

patterning the first silicon nitride layer to form a patterned hard mask;

etching the wafer using the patterned hard mask as an etching mask;

removing the patterned hard mask;

depositing a second silicon nitride layer on a gate stack in the wafer and extending on source/drains adjacent the gate stack, wherein the depositing the second silicon nitride layer is free from treatment processes performed using hydrogen as process gases;

annealing the wafer when the second silicon nitride layer is on the gate stack; and after the annealing, removing the second silicon nitride layer.

2. The method of claim 1 further comprising:

after the second sub layer is deposited, performing a second treatment process on the second sub layer using hydrogen as an additional process gas.

3. The method of claim 1, wherein the first treatment process further comprises:

generating a plasma from the hydrogen, wherein the plasma comprises hydrogen radicals and hydrogen ions; and filtering the plasma to remove the hydrogen ions, wherein the hydrogen radicals are used to treat the first sub layer.

4. The method of claim 1, wherein the first sub layer and the second sub layer are formed through atomic layer deposition (ALD) processes in an ALD chamber, and the first treatment process is also performed in the ALD chamber.

5. The method of claim 1 further comprising:

forming mandrels on the wafer, wherein the first silicon nitride layer is formed as a spacer layer contacting sidewalls and top surfaces of the mandrels; and performing an anisotropic etching process to remove horizontal portions of the first silicon nitride layer, with vertical portions of the first silicon nitride layer left as parts of the patterned hard mask.

6. The method of claim 1, further comprising:

etching a semiconductor substrate in the wafer to form trenches extending into the semiconductor substrate; and depositing a third silicon nitride layer extending into the trenches, wherein the depositing the third silicon nitride layer comprises an additional treatment process using hydrogen as a process gas.

7. The method of claim 1, wherein the first silicon nitride layer has a first stress therein, and the second silicon nitride layer has a second stress therein, and wherein the second stress is higher than the first stress.

8. The method of claim 1, wherein the depositing the first sub layer of the first silicon nitride layer comprises conducting a silicon-containing precursor into the process chamber, and the method further comprises, after the silicon-containing precursor is conducted, purge the silicon-containing precursor using nitrogen ($N_2$), wherein during the first treatment process on the first sub layer using the hydrogen as the process gas, nitrogen is present in the process chamber along with the hydrogen.

9. The method of claim 8 further comprising, after the first treatment process, purging the process gas that comprises the hydrogen using nitrogen ($N_2$).

10. A method comprising:

placing a wafer into a process chamber;

depositing a first silicon nitride layer over the wafer, the depositing comprising:

depositing a first sub layer of the first silicon nitride layer, wherein the depositing the first sub layer of the first silicon nitride layer comprises conducting a silicon-containing precursor into the process chamber; and after the silicon-containing precursor is conducted, purge the silicon-containing precursor using nitrogen ($N_2$);

performing a first treatment process on the first sub layer using hydrogen as a process gas, wherein during the first treatment process on the first sub layer using the hydrogen as the process gas, nitrogen is present in the process chamber along with the hydrogen; and after the first treatment process, depositing a second sub layer of the first silicon nitride layer over the first sub layer;

patterning the first silicon nitride layer to form a patterned hard mask;

etching the wafer using the patterned hard mask as an etching mask;

removing the patterned hard mask;

depositing a second silicon nitride layer on a gate stack in the wafer and extending on source/drains adjacent the gate stack, wherein the depositing the second silicon nitride layer is free from treatment processes performed using hydrogen as process gases;

annealing the wafer when the second silicon nitride layer is on the gate stack; and after the annealing, removing the second silicon nitride layer.

11. The method of claim 10 further comprising:

after the second sub layer is deposited, performing a second treatment process on the second sub layer using hydrogen as an additional process gas.

12. The method of claim 10, wherein the first treatment process further comprises:

generating a plasma from the hydrogen, wherein the plasma comprises hydrogen radicals and hydrogen ions; and filtering the plasma to remove the hydrogen ions, wherein the hydrogen radicals are used to treat the first sub layer.

13. The method of claim 10, wherein the first sub layer and the second sub layer are formed through atomic layer deposition (ALD) processes in an ALD chamber, and the first treatment process is also performed in the ALD chamber.

14. The method of claim 10 further comprising:

forming mandrels on the wafer, wherein the first silicon nitride layer is formed as a spacer layer contacting sidewalls and top surfaces of the mandrels; and performing an anisotropic etching process to remove horizontal portions of the first silicon nitride layer, with vertical portions of the first silicon nitride layer left as parts of the patterned hard mask.

15. The method of claim 10, further comprising:

etching a semiconductor substrate in the wafer to form trenches extending into the semiconductor substrate; and depositing a third silicon nitride layer extending into the trenches, wherein the depositing the third silicon nitride layer comprises an additional treatment process using hydrogen as a process gas.

16. The method of claim 10, wherein the first silicon nitride layer has a first stress therein, and the second silicon nitride layer has a second stress therein, and wherein the second stress is higher than the first stress.

17. A method comprising:
placing a wafer into a process chamber;
depositing a first silicon nitride layer over the wafer, the depositing comprising:
  depositing a first sub layer of the first silicon nitride layer;
  performing a first treatment process on the first sub layer using hydrogen as a process gas;
  after the first treatment process, depositing a second sub layer of the first silicon nitride layer over the first sub layer; and
  after the second sub layer is deposited, performing a second treatment process on the second sub layer using hydrogen as an additional process gas;
patterning the first silicon nitride layer to form a patterned hard mask;
etching the wafer using the patterned hard mask as an etching mask;
removing the patterned hard mask;
depositing a second silicon nitride layer on a gate stack in the wafer and extending on source/drains adjacent the gate stack, wherein the depositing the second silicon nitride layer is free from treatment processes performed using hydrogen as process gases;
annealing the wafer when the second silicon nitride layer is on the gate stack; and
after the annealing, removing the second silicon nitride layer.

18. The method of claim 17, wherein the first treatment process further comprises:
generating a plasma from the hydrogen, wherein the plasma comprises hydrogen radicals and hydrogen ions; and
filtering the plasma to remove the hydrogen ions, wherein the hydrogen radicals are used to treat the first sub layer.

19. The method of claim 17, wherein the first sub layer and the second sub layer are formed through atomic layer deposition (ALD) processes in an ALD chamber, and the first treatment process is also performed in the ALD chamber.

20. The method of claim 17, wherein the first silicon nitride layer has a first stress therein, and the second silicon nitride layer has a second stress therein, and wherein the second stress is higher than the first stress.

* * * * *